United States Patent
Yamaguchi

[11] Patent Number: 6,046,489
[45] Date of Patent: Apr. 4, 2000

[54] CAPACITOR WITH HIGH-DIELECTRIC-CONSTANT DIELECTRIC AND THICK ELECTRODE AND FABRICATION METHOD THEREOF

[75] Inventor: Hiromu Yamaguchi, Tokyo, Japan

[73] Assignee: NEC Corporation, Tokyo, Japan

[21] Appl. No.: 09/086,603

[22] Filed: May 29, 1998

[30] Foreign Application Priority Data

May 29, 1997 [JP] Japan ................................. 9-140384

[51] Int. Cl.[7] .................................................. H01L 29/00
[52] U.S. Cl. ........................ 257/532; 257/534; 257/738
[58] Field of Search .................................... 257/532–534, 257/738, 780, 908

[56] References Cited

U.S. PATENT DOCUMENTS

| | | | |
|---|---|---|---|
| 5,530,279 | 6/1996 | Yamamichi et al. | 257/310 |
| 5,671,175 | 9/1997 | Liu et al. | 365/149 |
| 5,793,076 | 8/1998 | Fazan et al. | 257/298 |
| 5,828,129 | 10/1998 | Roh | 257/751 |
| 5,872,697 | 2/1999 | Christensen et al. | 361/313 |
| 5,914,536 | 6/1999 | Shizuki et al. | 257/778 |

FOREIGN PATENT DOCUMENTS

| | | |
|---|---|---|
| 3-160755 | 7/1991 | Japan . |
| 5-6975 | 1/1993 | Japan . |
| 6-268156 | 9/1994 | Japan . |
| 7-94600 | 4/1995 | Japan . |
| 7-193136 | 7/1995 | Japan . |
| 8-222712 | 8/1996 | Japan . |
| 9-64298 | 3/1997 | Japan . |
| 9-102591 | 4/1997 | Japan . |
| 9-116115 | 5/1997 | Japan . |
| 9-270498 | 10/1997 | Japan . |

OTHER PUBLICATIONS

Kuniaki Koyama et al., "A Stacked Capacitor with $(Ba_xSr_{1-x})TiO_3$ For 256M DRAM", IEDM, Digest of Technical Papers, 1991, pp. 823–826.

P–Y Lesaicherre et al., "A Gbit–scale DRAM Stacked Capacitor Technology with ECR MOCVD $SrTiO_3$ and RIE Patterned $RuO_2$/TiN Storage Nodes", IEDM, Digest of Technical Papers, pp. 831–834.

*Primary Examiner*—Mahshid Saadat
*Assistant Examiner*—Allan R. Wilson
*Attorney, Agent, or Firm*—Young & Thompson

[57] ABSTRACT

A capacitor with a high dielectric-constant dielectric and a thick lower electrode decreases the leakage current. The thick lower electrode is on an interlayer insulating layer. Typically, the interlayer insulating layer is formed on or over a semiconductor substrate. The lower electrode has a top face, a bottom face, and side faces. The bottom face of the lower electrode is adjacent to the interlayer insulating layer. An insulating cap or cover layer is on and contacts the top face of the lower electrode. The insulating cap or cover layer covers the top face of the lower electrode and uncovers the side faces of the lower electrode. A capacitor dielectric layer covers and contacts the side faces of the lower electrode and the insulating cap or cover layer. An upper electrode is on and contacts the capacitor dielectric layer. The capacitor dielectric layer is sandwiched by the upper and lower electrodes to thereby constitute a capacitor structure.

6 Claims, 23 Drawing Sheets

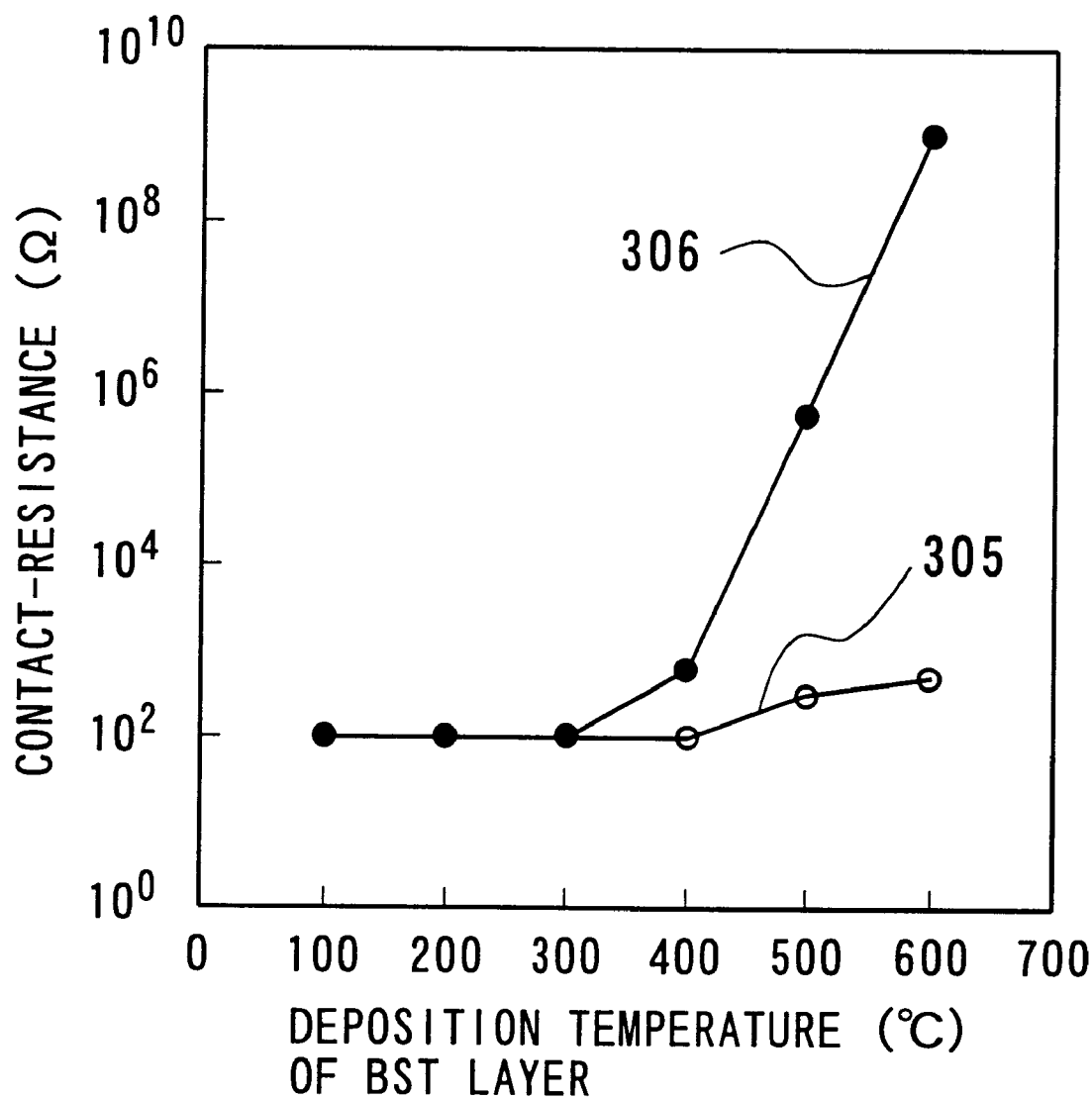

CAPACITOR WITH HIGH-DIELECTRIC-CONSTANT DIELECTRIC AND THICK ELECTRODE AND FABRICATION METHOD THEREOF

BACKGROUND OF THE INVENTION

1. Field of the Invention

The present invention relates to a capacitor formed over a semiconductor substrate and more particularly, to a capacitor with a high dielectric-constant capacitor dielectric and a thick capacitor electrode or electrodes, which is preferably applied to Gigabit-level Dynamic Random-Access Memories (DRAMs).

2. Description of the Related Art

In recent years, the integration level of the semiconductor integrated circuits (TCs) such as DRAMs has been becoming higher and higher and consequently, electronic elements in the ICs have been becoming miniaturized more and more.

Each storage capacitor of a DRAM needs to have a capacitance of approximately 30 fF to realize its information storing function even if the integration scale of the ICs becomes very high and the size of the storage capacitors becomes very small. To cope with this need, conventionally, the thickness increase of a lower electrode to utilize side faces of the lower electrode or the thickness decrease of a capacitor dielectric have been studied and developed.

As a capacitor dielectric for ICs, silicon dioxide ($SiO_2$) or silicon nitride ($Si_3N_4$), each of which has a low dielectric constant of approximately 3 to 7, has been popularly used. The dielectric constant of these two materials is insufficient for Gigabit-level DRAMs. Therefore, to realize Gigabit-level DRAMs, the lower electrode needs to have a large thickness of 5000 Å or more and at the same time, the capacitor dielectric needs to have a small thickness equivalent to several atomic layers.

However, the thickness increase of the lower electrode and the thickness decrease of the capacitor dielectric will cause the following problems.

Specifically, If the lower electrode is formed to have a large thickness of 5000 Å or more, it is very difficult to control the thickness and geometry of the lower electrode within a satisfactory accuracy because of disadvantages occurring in the exposure and dry etching processes. Also, if the capacitor dielectric is formed to have a small thickness equivalent to several atomic layers, electrons tend to penetrate through the capacitor dielectric due to the tunneling phenomenon. This means that the capacitor dielectric loses its function.

Thus, there is a limit to implement the Gigabit-level DRAMs by using $SiO_2$ or $Si_3N_4$ as the capacitor dielectric through the thickness increase technique of the lower electrode and the thickness decrease technique of the capacitor dielectric.

When a high-dielectric-constant material, which has a dielectric constant greater than $SiO_2$ or $Si_3N_4$, is used for the capacitor dielectric, an obtainable capacitance is higher than the case where $SiO_2$ or $Si_3N_4$ is used as the capacitor dielectric. As the high-dielectric-constant material whose dielectric constant is several tens or several hundreds times as much as that of $SiO_2$ and $Si_3N_4$, typically, $SrTiO_3$, (Ba,Sr)$TiO_3$ (i.e., BST), and Pb(Zr,Ti) (i.e., PZT) may be used. For example, a capacitor structure of this type for a 256-Megabit DRAM using BST was reported In an article, International Electron Devices Meeting (IEDM), Digest of Technical Papers, 1991, pp. 823–826, which was written by K. Koyama et al.

However, even if a high-dielectric-constant material with a dielectric constant of approximately 300 is used for the capacitor dielectric, a satisfactory capacitance for Glgabit-level DRAMs is unable to be realized.

Thus, in recent years, the thickness increase of a lower electrode in addition to the use of a high-dielectric-constant capacitor dielectric has been studied. For example, a capacitor structure of this type for a Gigabit-level DRAM was reported in an article, IEDM Digest of Technical Papers, 1994, pp. 831–834, which was written by P-Y. Lesaicherre et al. In the capacitor disclosed in this article a capacitor dielectric is made of $SrTiO_3$ with a high dielectric-constant, and a lower electrode of a storage capacitor has a composite structure formed by a thin TiN layer and a conductive, thick $RuO_2$ layer. The TiN layer Serves as a barrier to silicon diffused from a polysilicon contact plug, and the $RuO_2$ layer serves as a barrier to oxygen diffused from an ambient atmosphere.

FIG. 1 shows the configuration of a conventional storage capacitor of this type.

In FIG. 1, an interlayer insulating layer 1102 is formed on a main surface of a single-crystal silicon substrate 1101. A conductive contact plug 1103 is formed in a contact hole of the interlayer insulating layer 1102. The bottom of the plug 1103 is contacted with and electrically connected to the main surface of the substrate 1101.

A thick lower electrode 1104 is formed on the interlayer insulating layer 1102 to be overlapped with the contact plug 1103. The bottom of the lower electrode 1104 is contacted with and electrically connected to the top of the contact plug 1103.

A high dielectric-constant capacitor dielectric layer 1106 is formed on the interlayer insulating layer 1102 to cover the lower electrode 104. The dielectric layer 1106 is contacted with the top and side faces of the thick lower electrode 1104 and the surface of the interlayer insulating layer 1102.

An upper electrode 1107 is formed on the capacitor dielectric layer 1106 to be contacted therewith.

The upper and lower electrodes 1107 and 1104 and the capacitor dielectric layer 1106 constitute the storage capacitor of a DRAM.

With the conventional storage capacitor shown in FIG. 1, the following problems occurring in the process of forming or depositing the high dielectric-constant capacitor dielectric layer 1106 to cover the thick lower electrode 1104 need to be solved.

(i) The high dielectric-constant capacitor dielectric layer 1106 tends to be applied with a large stress near the root or heel 1108 of the thick lower electrode 1104. This is due to the different growing directions of crystal grains of the dielectric layer 1106 near the root 1108.

(ii) At the top corners between the top and side faces of the lower electrode 1104, a seam defect 1201 tends to occur in the capacitor dielectric layer 1106. The seam defect is formed by a lot of sub-defects collected into the narrow region of the capacitor dielectric layer 1106 due to separation and collision of growing columnar crystal grains of the dielectric layer 1106.

(iii) When the lower electrode 1104 is comprised of $RU_2O$, the lower electrode 1104 tends to be vaporized or oxidized during the process of forming the high dielectric-constant capacitor dielectric layer 1106 in a high-temperature oxygen atmosphere, resulting In the rough or uneven side faces 1202 of the lower electrode 1104. In this case, the thickness of the capacitor dielectric layer 1106 tends to be decreased locally and the seam defect tends to occur over the rough or uneven side faces 1202 of the lower electrode 1104.

The crack and seam defects in (i), (ii), and (iii) form a leakage path to thereby increase the leakage current between the lower and upper electrodes 1104 and 1107.

On the other hand, when the lower electrode 1104 has a $TiN/RuO_2$ composite structure shown in the above-described article, 1994 IEDM Digest of Technical Papers, the TiN barrier layer prevents the silicon atoms contained in the polysilicon contact plug 1103 from diffusing Into the lower electrode 1104. The purpose of this $TiN/RuO_2$ composite structure Is as follows:

If silicon atoms are diffused into the lower electrode 1104 from the polysilicon contact plug 1103, they create silicide. This suicide thus created is then oxidized to be silicon dioxide ($SiO_2$) during the process of forming the capacitor dielectric layer 1106 in a high-temperature oxygen atmosphere. This means that the $SiO_2$ layer is serially connected to the high dielectric-constant capacitor dielectric layer 1106. This $SiO_2$ layer reduces drastically the capacitance of the storage capacitor.

Moreover, TiN tends to be oxidized during the process of depositing the capacitor dielectric layer 1106. Thus, there is a possibility that the contact resistance of the lower electrode 1104 with the contact plug 1103 is increased due to the oxidized TiN.

FIG. 2 shows the configuration of another conventional storage capacitor of this type, which includes an improvement to decrease the leakage current between the lower and upper electrodes. This capacitor is disclosed in the Japanese Non-Examined Patent Publication No. 6-268156 published in 1994.

In FIG. 2, for the sake of simplification of description, the same reference numerals are attached to the same or corresponding elements as those in FIG. 1.

With the improved, conventional storage capacitor shown in FIG. 2, unlike the capacitor shown in FIG. 1, a part 1102a of the interlayer insulating layer 1102 located just below the lower electrode 1104 around the contact plug 1103 is formed to be thicker than the remainder of the layer 1102. In this case, the upper electrode 1107 is not contacted with the lower electrode 1104 due to existence of the part 1102a even if the seam and/or crack defects occur at the corner region 1109 of the dielectric layer 106. This structure decreases the leakage current between the lower and upper electrodes 1104 and 1107.

However, with the conventional storage capacitor shown in FIG. 2, as the deposition method of forming the capacitor dielectric layer 1106, a Physical Vapor Deposition (PVD) process that tends to generate the seam and/or crack defects is used. Therefore, the leakage current decrease is not satisfactory in spite of the existence of the part 1102a.

Also, no consideration is made for the leakage current near the top corners of the lower electrode 1104 and on the side faces thereof.

SUMMARY OF THE INVENTION

Accordingly, an object of the present invention is to provide a capacitor with a high dielectric-constant dielectric and a thick lower electrode that decreases the leakage current between upper and lower electrodes, and a fabrication method of the capacitor.

Another object of the present invention is to provide a capacitor with a high dielectric-constant dielectric and a thick lower electrode that prevents the contact resistance of a lower capacitor electrode from increasing even if a diffusion barrier layer is additionally provided, and a fabrication method of the capacitor.

The above objects together with others not specifically mentioned will become clear to those skilled in the art from the following description.

According to a first aspect of the present invention, a capacitor designed for a semiconductor device is provided, which is comprised of a thick lower electrode formed on an interlayer insulating layer. Typically, the interlayer insulating layer is formed on or over a semiconductor substrate. The lower electrode has a top face, a bottom face, and side faces. The bottom face of the lower electrode is opposite to the interlayer insulating layer.

An insulating cap or cover layer is formed on the top face of the lower electrode to be contacted therewith. The insulating cap or cover layer covers the top face of the lower electrode and uncovers the side faces of the lower electrode.

A capacitor dielectric layer is formed to cover the lower electrode and the insulating cap or cover layer. The capacitor dielectric layer is contacted with the insulating cap or cover layer and the side faces of the lower electrode.

An upper electrode is formed on the capacitor dielectric layer to be contacted therewith.

The capacitor dielectric layer is sandwiched by the upper and lower electrodes to thereby constitute a capacitor structure.

With the capacitor according to the first aspect of the present invention, the insulating cap or cover layer is formed on the top face of the lower electrode to be contacted therewith, so that the insulating cap or cover layer covers the top face of the lower electrode and uncovers the side faces of the lower electrode. Therefore, a seam defect will occur in the capacitor dielectric layer near the periphery of the insulating cap layer, not at the top corners of the lower electrode.

Accordingly, even if a defect such as a seam occurs in the capacitor dielectric layer, the upper electrode is not contacted with the lower electrode due to the existence of the cap layer. This means that the leakage current between the upper and lower electrodes is decreased.

In a preferred embodiment of the capacitor according to the first aspect of the present invention, a part of the interlayer insulating layer is thicker than a remainder of the interlayer insulating layer. The part of the interlayer insulating layer surrounds the contact plug and is located just below the lower electrode.

In this case, even if a defect such as a crack occurs near is the bottom corners of the lower electrode, the upper electrode is not contacted with the lower electrode due to the existence of the thicker part of the interlayer insulating layer. Therefore, there is an additional advantage that the leakage current between the upper and lower electrodes is further decreased, In another preferred embodiment of the capacitor according to the first aspect of the present invention, a diffusion barrier layer is additionally formed between the lower electrode and a conductive contact plug formed in a contact hole of the interlayer insulating layer.

According to a second aspect of the present invention, a fabrication method of the capacitor according to the first aspect of the present invention is provided, which is comprised of the following steps (a) to (g):

(a) An interlayer insulating layer is prepared.

(b) A conductive layer for a thick lower electrode is formed on the interlayer insulating layer.

(c) An insulating layer for an insulating cap or cover layer is formed on the conductive layer.

(d) The insulating layer for the insulating cap layer is patterned to have a same plan shape as the lower electrode, thereby forming the insulating cap layer.

(e) Using the patterned insulating layer for the insulating cap layer as a mask, the conductive layer for the lower electrode is patterned to thereby form the lower electrode.

The lower electrode has a top face, a bottom face, and side faces. The bottom face of the lower electrode is opposite to the interlayer insulating layer. The top face of the lower electrode is contacted with the insulating cap layer. The side faces of the lower electrode are uncovered with the insulating cap layer.

(f) A capacitor dielectric layer is formed to cover the lower electrode and the insulating cap layer. The dielectric layer is contacted with the insulating cap layer and the side faces of the lower electrode.

(g) An upper electrode Is formed on the dielectric layer to be contacted therewith.

The dielectric layer is sandwiched by the upper and lower electrodes to thereby constitute a capacitor structure.

With the fabrication method of a capacitor according to the second aspect of the present invention, it is clear that the capacitor according to the first aspect of the present invention is fabricated.

Also, the patterned insulating layer for the insulating cap layer is used for a mask in the step (e) of forming the lower electrode. Therefore, the number or count of necessary process steps is prevented from increasing due to addition of the insulating cap layer.

According to a third aspect of the present invention, another capacitor designed for a semiconductor device is provided, which is comprised of a diffusion barrier layer formed on an interlayer insulating layer having a conductive contact plug therein. A bottom face of the diffusion barrier layer is contacted with the contact plug. Typically, the interlayer insulating layer is formed on or over a semiconductor substrate.

A thick lower electrode is formed on the diffusion barrier layer. The lower electrode includes a core part having a top face, a bottom face, and side faces and a shell part surrounding the core part. The top and bottom faces of the core part are covered with the shell part. The bottom face of the core part is not covered with the shell part and is contacted with the diffusion barrier layer. The shell part of the lower electrode has a convex and round surface. The shell part of the lower electrode has a diffusion barrier property to oxygen.

A capacitor dielectric layer is formed to cover the lower electrode to be contacted with the convex and round surface of the shell part of the lower electrode. The capacitor dielectric layer is contacted with the round surface of the shell part of the lower electrode.

An upper electrode is formed on the capacitor dielectric layer to be contacted therewith.

The capacitor dielectric layer is sandwiched by the upper and lower electrodes to thereby constitute a capacitor structure.

With the capacitor according to the third aspect of the present invention, the lower electrode includes the core part and the shell part that surrounds the core part and has a diffusion barrier property to oxygen. In other words, the core part is covered with or protected by the shell part having a diffusion barrier property to oxygen.

Accordingly, the diffusion barrier layer formed on the interlayer insulating layer is prevented from being oxidized during a heat-treatment process. As a result, the contact resistance of the lower capacitor electrode is prevented from increasing even if the diffusion barrier layer is provided.

In a preferred embodiment of the capacitor according to the third aspect of the present invention, the core part of the lower electrode is entirely covered with the shell part thereof.

In another preferred embodiment of the capacitor according to the third aspect of the present inventions the core part of the lower electrode is partially covered with the shell part thereof while uncovering the top face of the core part from the shell part.

In still another preferred embodiment of the capacitor according to the third aspect of the present invention, the diffusion barrier layer formed on the interlayer insulating layer has a diffusion barrier property to silicon.

According to a fourth aspect of the present invention, a fabrication method of the capacitor according to the third aspect of the present invention is provided, which is comprised of the following steps (a) to (g):

(a) An interlayer insulating layer having a conductive contact plug therein is prepared.

(b) A diffusion barrier layer is formed on the interlayer insulating layer so that a bottom face of the diffusion barrier layer is contacted with the contact plug.

(c) A core part of a lower electrode is formed on the diffusion barrier layer. The core part have a top face, a bottom face, and side faces. The bottom face of the core part is contacted with the diffusion barrier layer.

(d) A conductive material is deposited to cover the core part of the lower electrode by a process with a low step-coverage capability (e.g., a PVD process), thereby forming a shell part of the lower electrode.

The bottom face of the core part is not covered with the shell part and is contacted with the diffusion barrier layer. The shell part of the lower electrode has a convex and round surface. The shell part of the lower electrode has a diffusion barrier property to oxygen.

(e) A capacitor dielectric Layer is formed to cover the lower electrode, so that the capacitor dielectric layer is contacted with the convex and round surface of the shell part of the lower electrode.

(f) An upper electrode is formed on the capacitor dielectric layer to be contacted therewith.

The capacitor dielectric layer is sandwiched by the upper and lower electrodes to thereby constitute a capacitor structure.

With the fabrication method of a capacitor according to the fourth aspect of the present invention, it is clear that the capacitor according to the third aspect of the present invention is fabricated.

In a preferred embodiment of the method according to the fourth aspect of the present invention, the conductive material is deposited to cover the top and side faces of the core part of the lower electrode in the step (d) of forming the shell part of the lower electrode.

In another preferred embodiment of the method according to the fourth aspect of the present invention, the conductive material is deposited to cover the top and side faces of the core part of the lower electrode In the step (d) of forming the shell part of the lower electrode. Then, the deposited conductive material is selectively removed to uncover the top face of the core part of the lower electrode prior to the step (e) of forming the capacitor dielectric layer.

In still another preferred embodiment of the method according to the fourth aspect of the present invention, the shell part of the lower electrode is formed by a material having an oxygen barrier function.

BRIEF DESCRIPTION OF THE DRAWINGS

In order that the present invention may be readily carried into effect, it will now be described with reference to the accompanying drawings.

FIG. 16 is a graph showing the temperature dependence of the contact resistance according to the sixth embodiment of the present invention and a third comparative example with respect to the BST formation temperature.

DETAILED DESCRIPTION OF THE PREFERRED EMBODIMENTS

Figure 1:
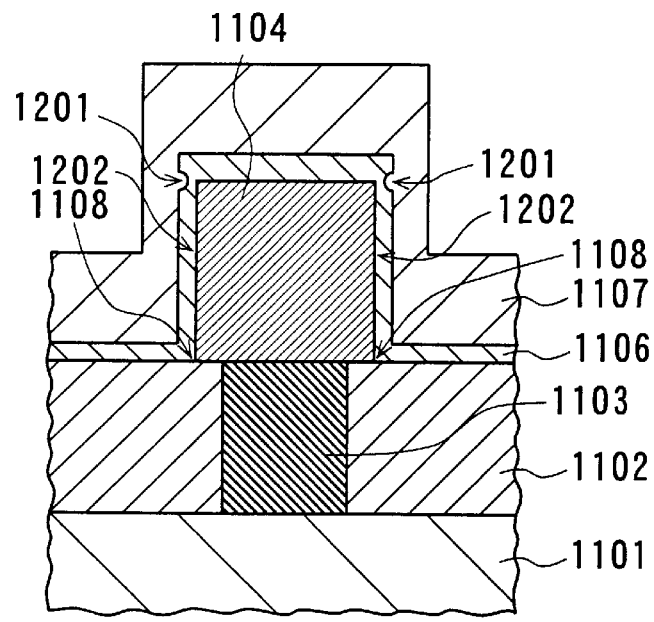
FIG. 1 is a partial, cross-sectional view of a conventional capacitor.

Preferred embodiments of the present invention will be described in detail below while referring to the drawings attached.

First Embodiment

Figure 3:
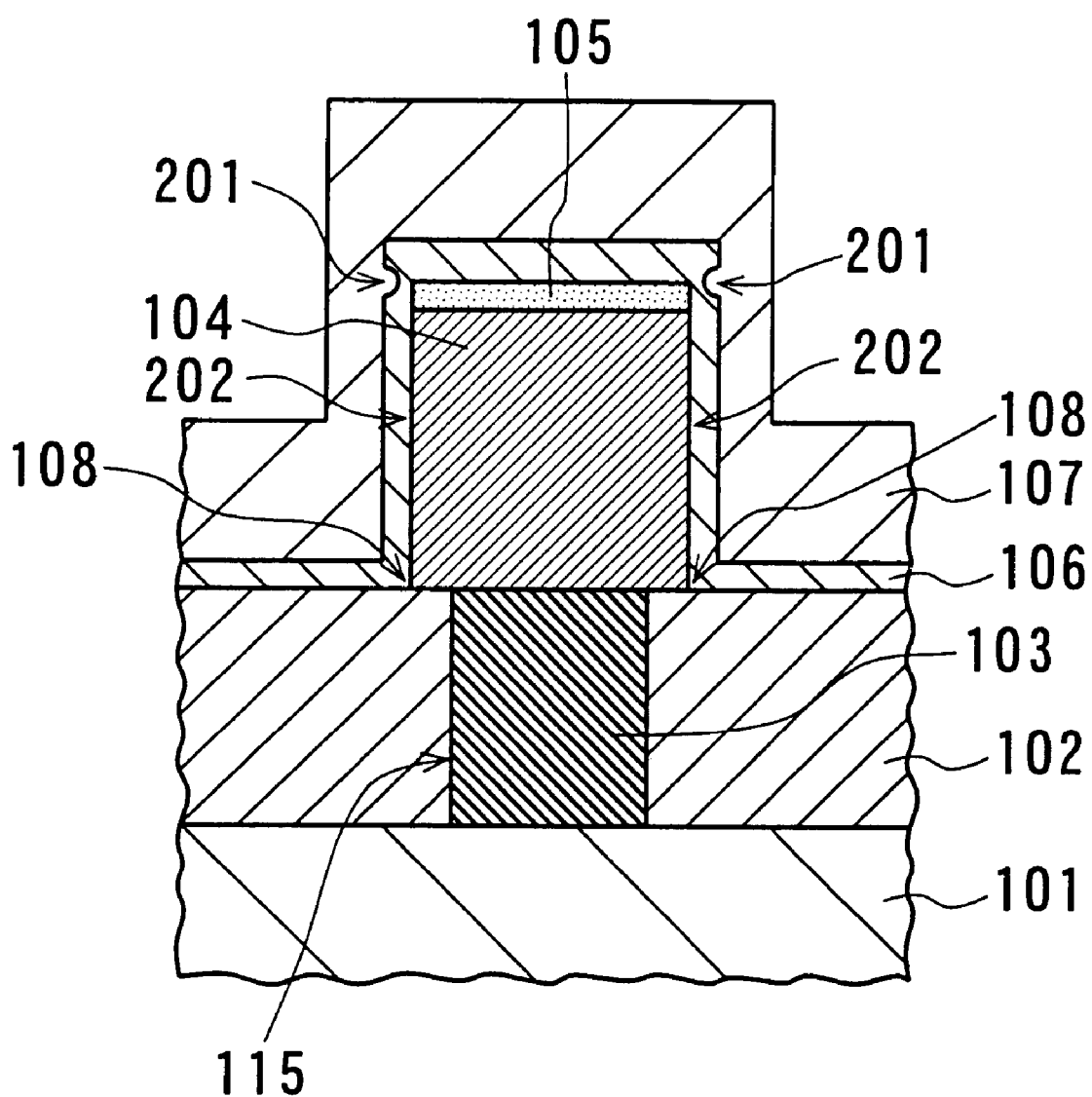
FIG. 3 is a partial, cross-sectional view of a capacitor according to a first embodiment of the present invention.

FIG. 3 shows the configuration of a capacitor applied to a Gigabit-scale DRAM according to a first embodiment of the present invention.

In FIG. 3, an interlayer insulating layer 102 with a thickness of 500 nm is formed on a main surface of an n-type single-crystal silicon (Si) substrate 101 with a resistivity of 0.01 Ω·cm. The interlayer insulating layer 102, which is made of $SiO_2$, has a contact hole 115 filled with a contact plug 103 made of phosphorus-doped polysilicon. The bottom of the contact plug 103 is contacted with and electrically connected to the substrate 101, and the top of the contact plug 103 is exposed from the layer 102.

Although not shown in FIG. 3, typically, a diffusion region is formed in the substrate 101 and the contact plug 103 is contacted with and electrically connected to the diffusion region.

A lower electrode 104 with a thickness of 400 nm is formed on the interlayer insulating layer 102 to be contacted with the top of the polysilicon contact plug 103. The thick lower electrode 104 Is made of conductive $RuO_2$ and has a rectangular cross section and a specific plan shape such as a circle and rectangle.

An insulating cap layer 105 with a thickness of 100 nm is formed on the top face of the lower electrode 104. The cap layer 105 is made of $SiO_2$ fabricated by the so-called Spin-On-Glass (SOG) method. The cap Layer 105 covers the entire top face of the lower electrode 104 and uncover the entire side faces thereof.

A high-dielectric-constant dielectric layer 106 with a thickness of 50 nm, which is made of polycrystalline BEST, is formed on the interlayer insulating layer 102 to cover the cap layer 105 and the side faces of the lower electrode 104.

The BST layer 106 is fabricated by an Electron Cyclotron Resonance Chemical Vapor Deposition (ECR-CVD) process.

An upper electrode 107 with a thickness of 200 nm is formed on the dielectric layer 106. The upper electrode 107 is made of Ru. The upper electrode 107 is fabricated by a sputtering process.

With the capacitor according to the first embodiment of the present invention, the insulating cap layer 105 of $SiO_2$ is formed on the top face of the lower electrode 104 to be contacted therewith, so that the insulating cap layer 105 covers the top face of the lower electrode 104 and uncovers the side faces thereof. Therefore, a seam defect will occur in the capacitor dielectric layer 106 near the periphery of the insulating cap layer 105, not at the top corners of the lower electrode 104.

Accordingly, even if a defect such as a seam occurs in the capacitor dielectric layer 106, the upper electrode 107 is not contacted with the lower electrode 104 due to the existence of the cap layer 105. This means that the leakage current between the upper and lower electrodes 107 and 104 is decreased.

The thickness of the insulating cap layer 105 is determined so that the upper and lower electrodes 107 and 104 are not contacted with one another even if a seam defect is generated in the dielectric layer 106 near the top corner of the lower electrode 104. For example, a preferred thickness of the insulating cap layer 105 is 10 to 200 nm. It is more preferred that the thickness of the insulating cap Layer 105 is 50 to 80 nm.

The capacitor according to the first embodiment is fabricated in the following way.

Figure 4A:
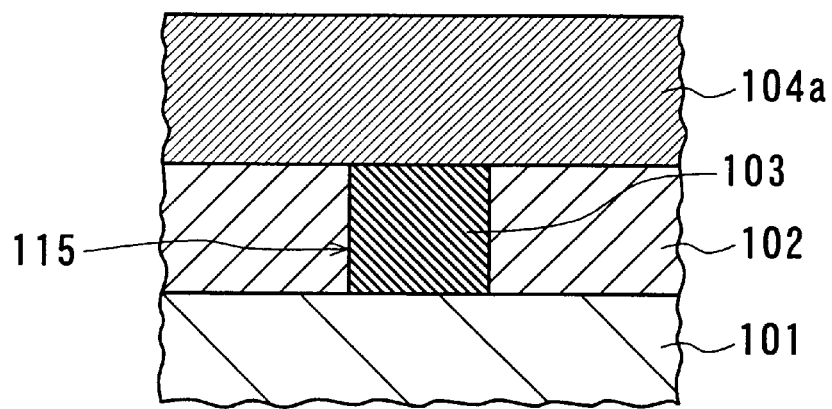
FIGS. 4A to 4F are partial, cross-sectional views of a capacitor showing a fabrication method of the capacitor according to the first embodiment in FIG. 3, respectively.

First, as shown in FIG. 4A, the $SiO_2$ interlayer insulating layer 102 with a thickness of 500 nm is formed on the main surface of the Si substrate 101 with a resistivity of 0.01 $\Omega \cdot cm$ by a thermal CVD process. Next, the penetrating contact hole 115 is formed in the interlayer insulating layer 102 by a dry etching process.

A phosphorus-doped polysilicon layer (not shown) with a thickness of 1 $\mu m$ is formed on the interlayer insulating layer 102 so as to fill the contact hole 115 of the layer 102 by a CVD process. Then, the phosphorus-doped polysilicon layer is selectively etched back by a Reactive-Ion Etching (RIE) process using chlorine ($Cl_2$) as an etching gas, thereby leaving the polysilicon film in the contact hole 115. Thus, the polysilicon plug 103 is formed in the contact hole 115 of the interlayer insulating layer 102, as shown in FIG. 4A.

Subsequently, a $RUO_2$ layer 104a with a thickness of 400 nm is deposited on the interlayer insulating layer 102 by a reactive sputtering process at room temperature, in which a Ru target is used. The state at this stage is shown in FIG. 4A.

Figure 4B:
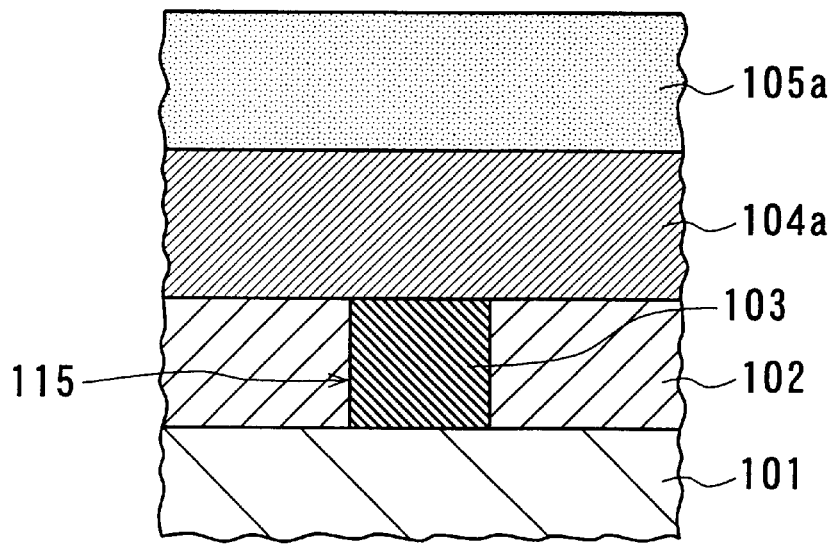

On the $RuO_2$ layer 104a thus deposited, organic silica is coated by a SOG process, thereby forming a silica layer with a thickness of 400 nm. The silica layer is then annealed at a temperature of 350° C. for one hour, thereby forming a SOG-$SiO_2$ layer 105a, as shown in FIG. 4B.

Figure 4C:
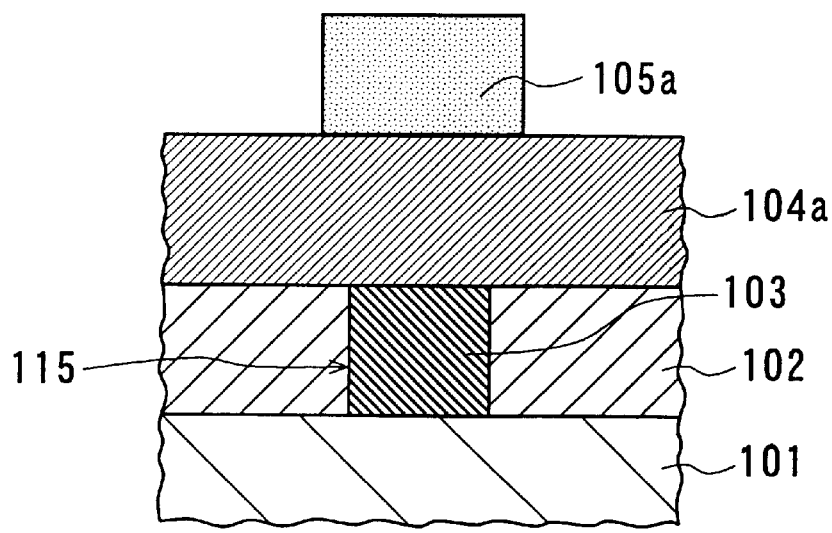

After a photoresist film (not shown) Is formed on the SOG-$SiO_2$ layer 105a, the photoresist film is exposed and developed to form a photoresist mask (not shown) with a same plan shape as the lower electrode 104. While using the photoresist mask, the SOG-$SiO_2$ layer 105a is patterned by an ECR plasma etching process using $CH_3$ as an etching gas. The photoresist mask is then removed. The state at this time is shown In FIG. 4C.

Further, using the patterned SOG-$SiO_2$ layer 105a as a mask, the underlying $RuO_2$ layer 104a is patterned by an ECR plasma etching process while a mixture of $Cl_3$ and $O_2$ is used as an etching gas, the substrate temperature is set as room temperature, and a gas pressure is set as 2 mTorr, until the underlying interlayer insulating layer 102 is exposed.

Through this etching process, the thickness of the $RUO_2$ layer 104a is decreased to have a thickness of approximately 100 nm, thereby forming the insulating cap layer 105 and the lower electrode 104. The state at this stage is shown in FIG. 4D.

Since the patterned $SiO_2$ layer is used for a mask for the insulating cap layer 105 and the lower electrode 104, the number or count of necessary process steps is not increased by addition of the insulating cap layer 105.

Figure 4D:
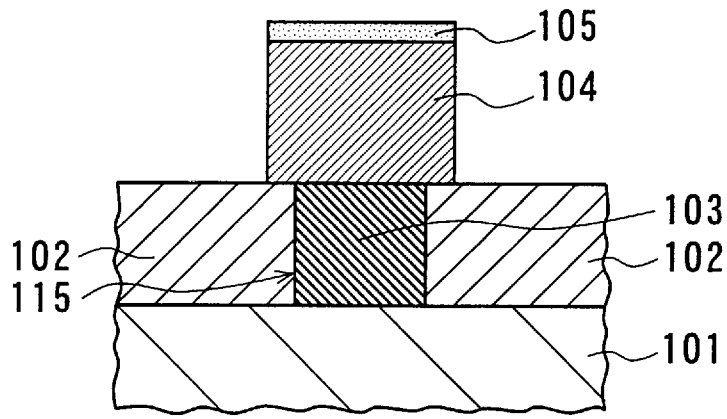

The lower electrode 104 is formed by the above-identified process and therefore, the lower electrode 104 has a rectangular cross section, as shown in FIG. 4D.

Figure 4E:
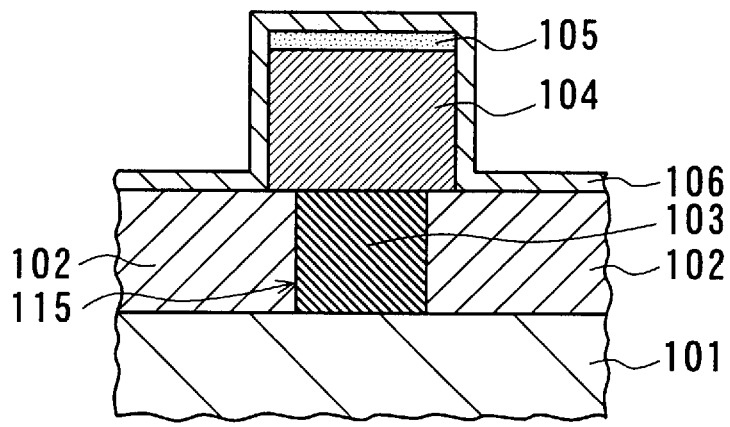

Following this ECR-plasma etching process, the polycrystalline BST layer 105 with a thickness of 50 nm is formed on the interlayer insulating layer 102 to cover the lower electrode 104 and the cap layer 105 by an ECR plasma-enhanced CVD process using a mixture of strontium bis-DiPivaloylMethane $(DPM)_2$, $Ba(DPM)_2$, and $Ti(O—I—CH_3)_4$ as a source gas at a substrate temperature of 550° C. and a source-gas pressure of 7 mTorr. The state at this stage is shown in FIG. 4E.

Finally, a Ru layer (not shown) with a thickness of 200 nm is deposited on the interlayer insulating layer 102 to cover the polycrystalline BST layer 105 and the lower electrode 104 by a sputtering process using a Ru target. The Ru layer is then patterned by an ECR plasma etching process using a mixture of $Cl_2$ and $O_2$ as an etching gas at a substrate temperature of room temperature and a source-gas pressure of 2 mTorr.

Figure 4F:
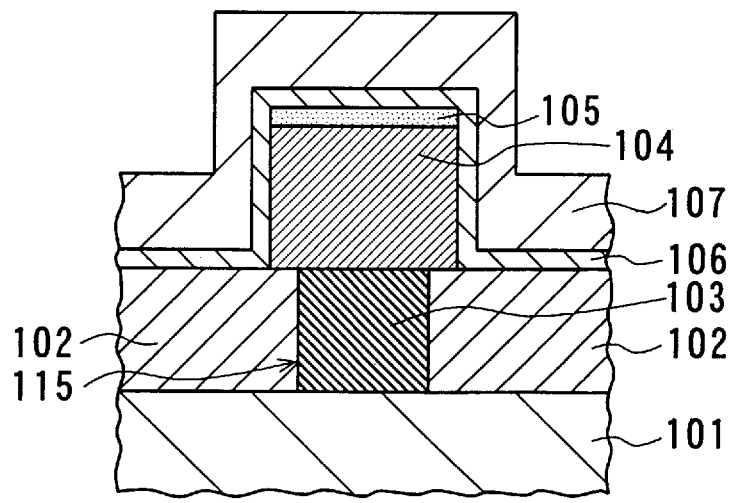

Thus, the capacitor according to the first embodiment is fabricated, as shown in FIG. 4F.

To confirm the advantage of the present invention, the inventor actually fabricated the capacitor according to the first embodiment and a capacitor having the conventional structure shown in FIG. 1 as a first comparative example. Then, the leakage current characteristics were measured for these capacitors. The result of the measurement is shown in FIG. 5.

Figure 5:
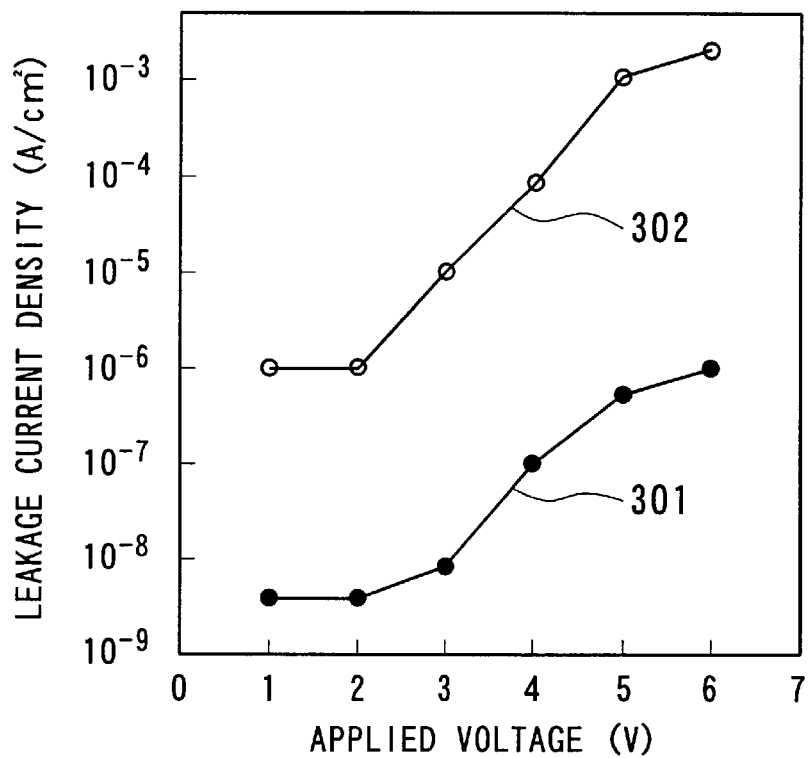
FIG. 5 is a graph showing the relationship of the leakage current density with the applied voltage of the capacitor according to the first embodiment of the present invention and a first comparative example.

As shown in FIG. 5, the curve 301 indicates the leakage current characteristic of the capacitor according to the first embodiment and the curve 302 indicates that of the first comparative example.

It is seen from FIG. 5 that the leakage current density is $4 \times 10^{-9}$ $A/cm^2$ when a voltage of 1 V is applied across the lower and upper electrodes in the first embodiment. On the other hand, the leakage current density is $1 \times 10^{-6}$ $A/cm^2$ when a voltage of 1 V is applied across the lower and upper electrodes in the first comparative example, which is much greater than the first embodiment. This means that the leakage current of the first embodiment is decreased compared with the first comparative example.

Further, the inventor actually fabricated the capacitor according to the first embodiment and a capacitor having the same structure as the first embodiment except that the polycrystalline BST layer 106 was changed to be amorphous as a second comparative example. Then, the leakage current and the dielectric constant were measured for these capacitors. The result of the measurement is shown In FIG. 6.

Figure 6:
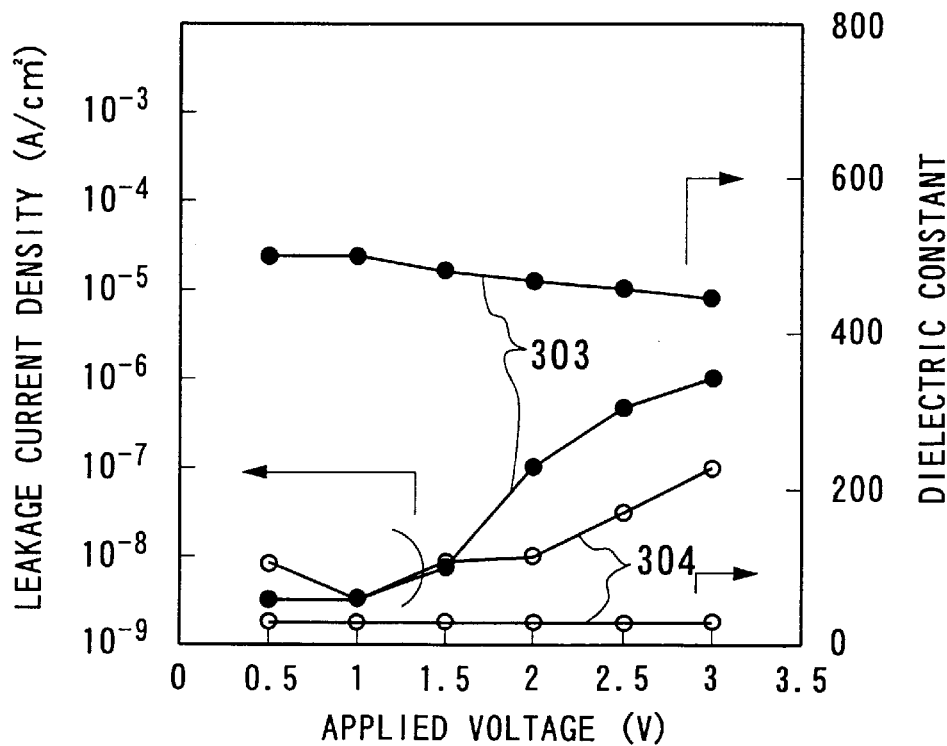
FIG. 6 is a graph showing the relationships of the leakage current density and the dielectric constant with the applied voltage of the capacitor according to the first embodiment of the present invention and a second comparative example.

As shown in FIG. 6, the reference numeral 303 indicates the leakage current and the dielectric constant characteristics of the capacitor according to the first embodiment and the curve 304 indicates those of the second comparative example.

It is seen from FIG. 6 that the leakage current density is as low as $4\times10^{-9}$ A/cm$^2$ when a voltage of 1 V is applied across the lower and upper electrodes in the first embodiment and the second comparative example. However, it is seen from FIG. 6 that the dielectric constant is as low as 30 in the second comparative example, which is much smaller than the dielectric constant of approximately 500 in the first embodiment.

Accordingly, it was confirmed that polycrystalline BST is preferred to realize the wanted capacitor characteristics to amorphous BST. Approximately the same result was given In the cases of single-crystal BST alone, and the mixture of single-crystal grains and amorphous regions and the mixture of polycrystalline grains and amorphous regions.

In the first embodiment, BST is used for the high-dielectric-constant layer 105. However, any other material may be used for the present invention. For example, the following materials are preferably used.

(a) Dielectrics expressed by a general formula ABO$_3$, where A is at least one element selected from the group consisting of Ba, Sr, Pb, Ca, La, Li, and K, and B is at least one element selected from the group consisting of Zr, Ti, Ta, Nb, Mg, Fe, Zn, and W.

Examples are SrTiO$_3$, PbTiO$_3$, Pb(Zr,Ti)O$_3$, (Pb,Zr)TiO$_3$, Pb(Mg,Nb)O$_3$, Pb(Mg,W)O$_3$, Pb(Zn,Nb)O$_3$, LiTaO$_3$, LiNbO$_3$, KTaO$_3$, and KNbO$_3$.

(b) Dielectrics expressed by a general formula (Bi$_2$O$_2$)(X$_{m-1}$Y$_m$O$_{3m+1}$), where X is at least one element selected from the group consisting of Ba, Sr, Pb, Ca, K, and Bi, Y is at least one element selected from the group consisting of Nb, Ta, Ti, and W, and m is a positive integer of 1 to 5. Examples are Bi$_4$Ti$_3$O$_{12}$, SrBi$_2$Ta$_2$O$_9$, and SrBi$_2$Nb$_2$O$_9$.

(c) Ta$_2$O$_5$ (d) Ba$_2$MgF$_4$

In the first embodiment, the contact plug 103 is made of n-type polysilicon. However, the plug 103 may be made of any material having a silicon and/or oxygen barrier function, such as RuO$_2$.

Second Embodiment

Figure 7:
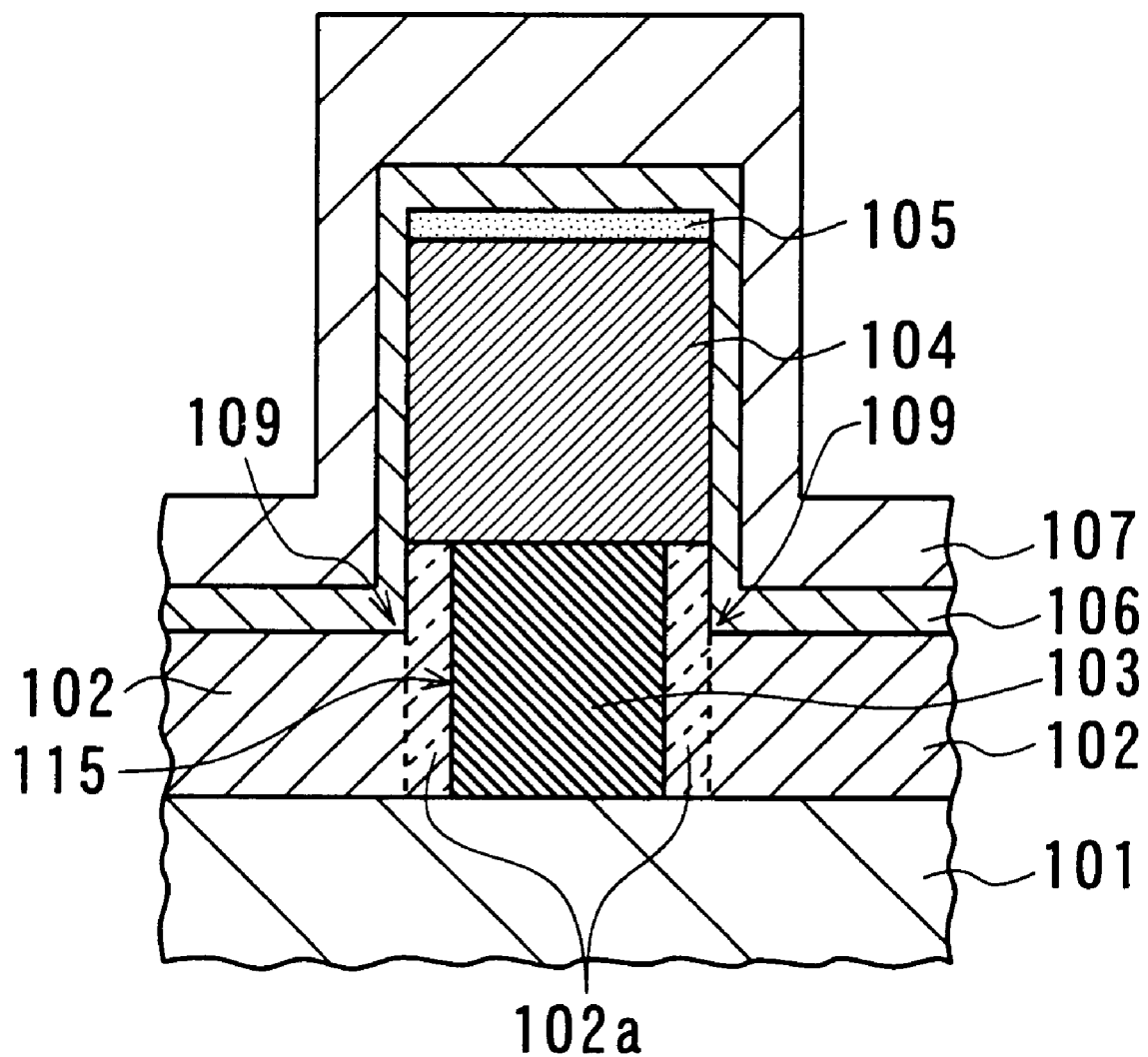
FIG. 7 is a partial, cross-sectional view of a capacitor according to a second embodiment of the present invention.

FIG. 7 shows the configuration of a capacitor applied to a Gigabit-scale DRAM according to a second embodiment of the present invention.

The capacitor according to the second embodiment has the same configuration as the first embodiment except that a part 102a of the interlayer insulating layer 102 is thicker than the remainder of the layer 102. The part 102a of the interlayer insulating layer 102 surrounds the contact plug 103 and it Is located just below the lower electrode 104. The part 102a of the interlayer insulating layer 102 is 500 nm in thickness, and the remainder of the insulating layer 102 is 300 nm in thickness.

The capacitor according to the second embodiment is fabricated in the following way.

First, the structure shown in 8A is formed through she same process steps as shown in FIGS. 4A to 4D.

Figure 8A:
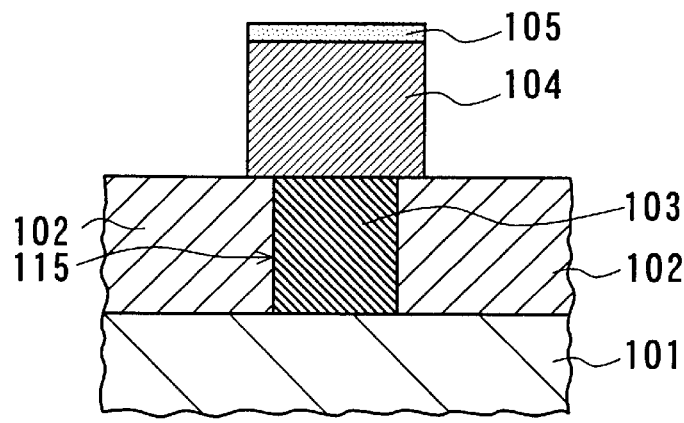
FIGS. 8A to 8C are partial, cross-sectional views of a capacitor showing a fabrication method of the capacitor according to the second embodiment In FIG. 7, respectively.
Figure 8B:
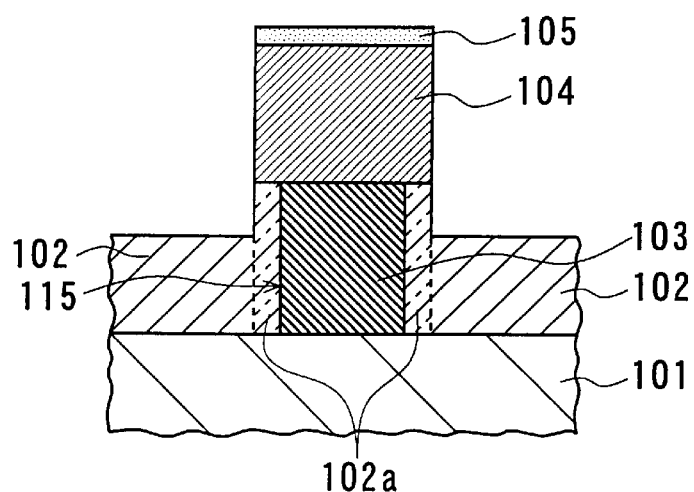

Then, the interlayer insulating layer 102 with a thickness of 500 nm is selectively etched to have a thickness of 300 nm using the insulating cap layer 105 as a mask, as shown in FIG. 8B. Thus, the cylindrical part 102a of the interlayer insulating layer 102 is formed to surround the contact plug 103.

Figure 8C:
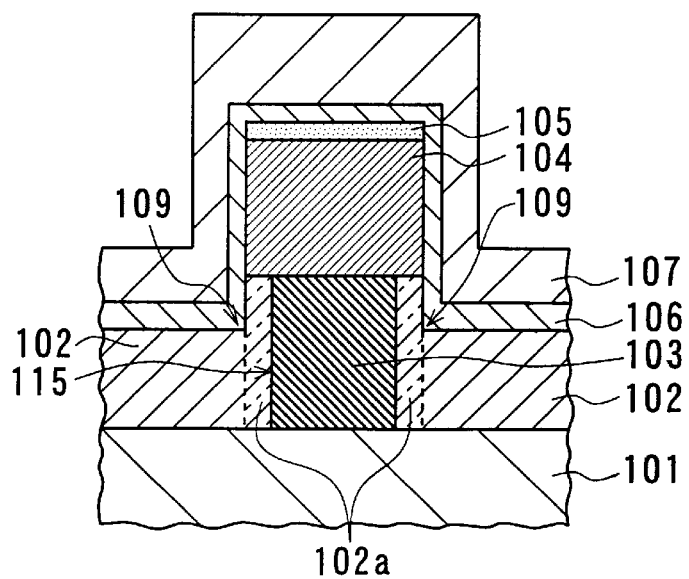

Subsequently, the BST dielectric layer 106 and the upper electrode 107 are successively formed In the same way as those in the first embodiment, as shown in FIG. 8C.

With the capacitor according to the second embodiment of the present invention, it is clear that there are the same advantages as those in the first embodiment. Further, the lower corner 109 of the dielectric layer 106 is positioned lower than the bottom of the lower electrode 104 and therefore, the leakage current is more difficult to flow than the first embodiment.

Figure 9:
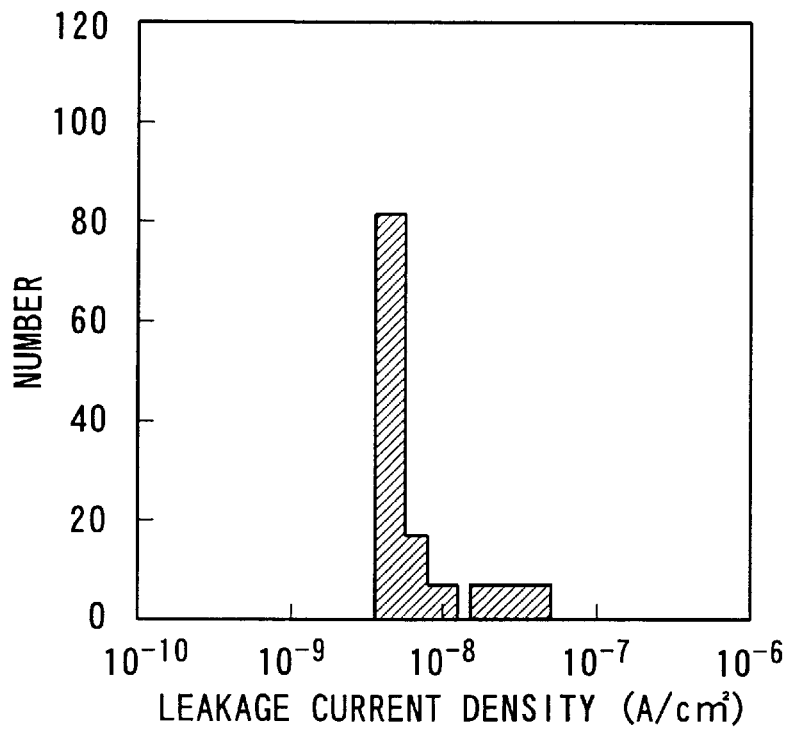
FIG. 9 is a graph showing the distribution of the leakage current density of the capacitor according to the first embodiment of the present invention.
Figure 10:
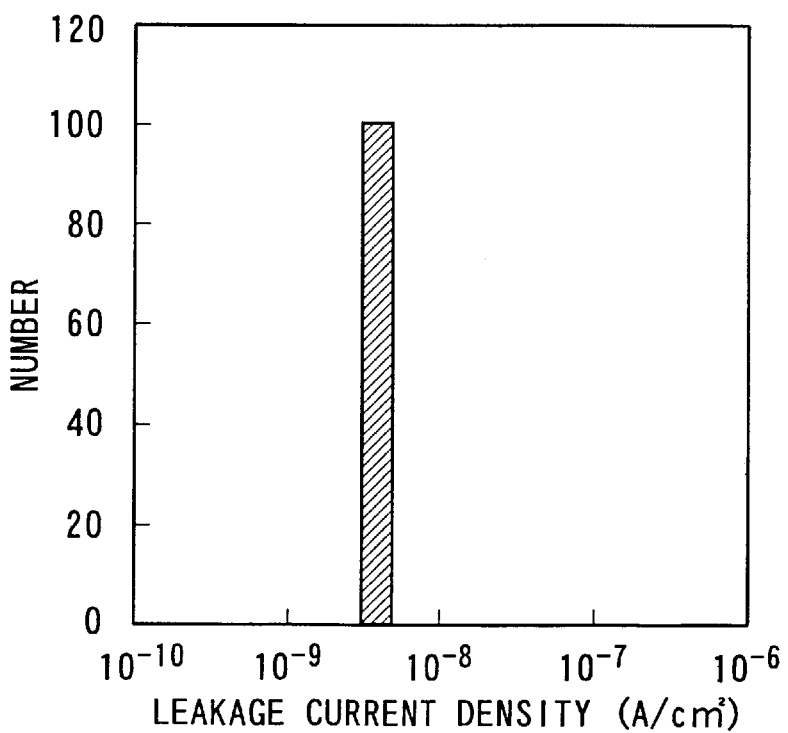
FIG. 10 is a graph showing the distribution of the leakage current density of the capacitor according to the second embodiment of the present invention In FIG. 7.

FIGS. 9 and 10 show the distribution of the leakage current density of the capacitor according to the first and second embodiments, respectively. In FIGS. 9 and 10, the axis of abscissas represents the leakage current density and the axis of ordinates represents the number or count of the capacitors.

This result was given through the inventor's test as follows.

A hundred capacitors according to the first embodiment and a hundred capacitors according to the second embodiment were fabricated. Then, the leakage current density of these capacitors was measured while a bias voltage of 1 V was applied across the upper and lower electrodes 107 and 104.

With the capacitor according to the first embodiment, as shown in FIG. 9, almost all the capacitors have a leakage current density of $4\times10^{-9}$ A/cm$^2$ and a part of these capacitors have a leakage current density of approximately $4\times10^{-8}$ A/cm$^2$. On the other hand, with the capacitor according to the second embodiment, as shown in FIG. 10, all the capacitors has a leakage current of $4\times10^{-9}$ A/cm$^2$.

Therefore, the capacitor according to the second embodiment has a better or narrow distribution of the leakage current density than the capacitor according to the first embodiment.

Third Embodiment

Figure 11A:
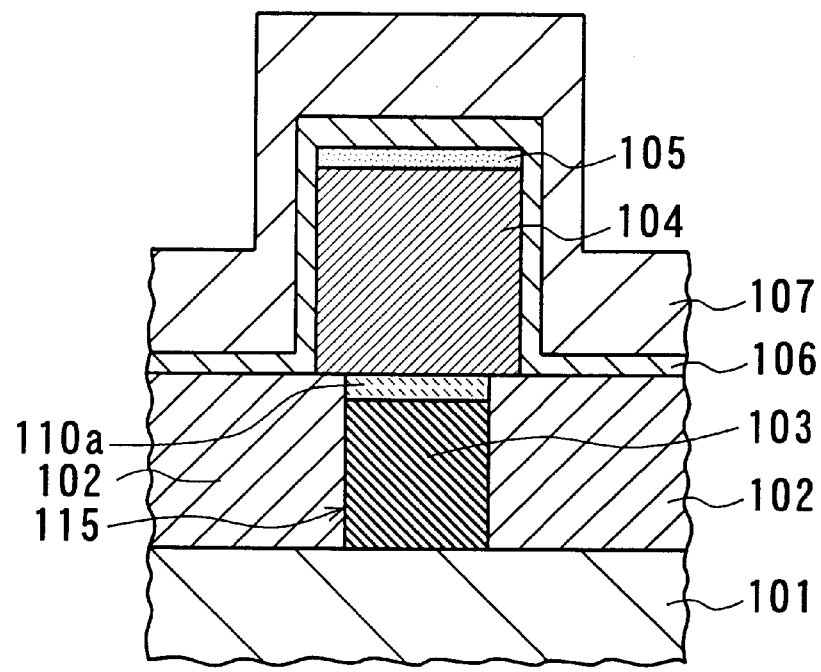
FIG. 11A is a partial, cross-sectional view of a capacitor according to a third embodiment of the present invention.

FIG. 11A shows the configuration of a capacitor applied to a Gigabit-scale DRAM according to a third embodiment of the present invention.

The capacitor according to the third embodiment has the same configuration as that of the first embodiment except that a diffusion barrier layer 110a is additionally formed between the polysilicon contact plug 103 and the lower electrode 104. The diffusion barrier 110a is located in the contact hole 115 of the interlayer insulating layer 102.

Clearly, there are the same advantage as that of the first embodiment.

Also, the diffusion barrier layer 110a prevents the silicon atoms contained in the polysilicon contact plug 103 from diffusing into the lower electrode 104. As a result, there is an additional advantage that the disadvantage due to the diffusion of silicon is avoided.

Fourth Embodiment

Figure 11B:
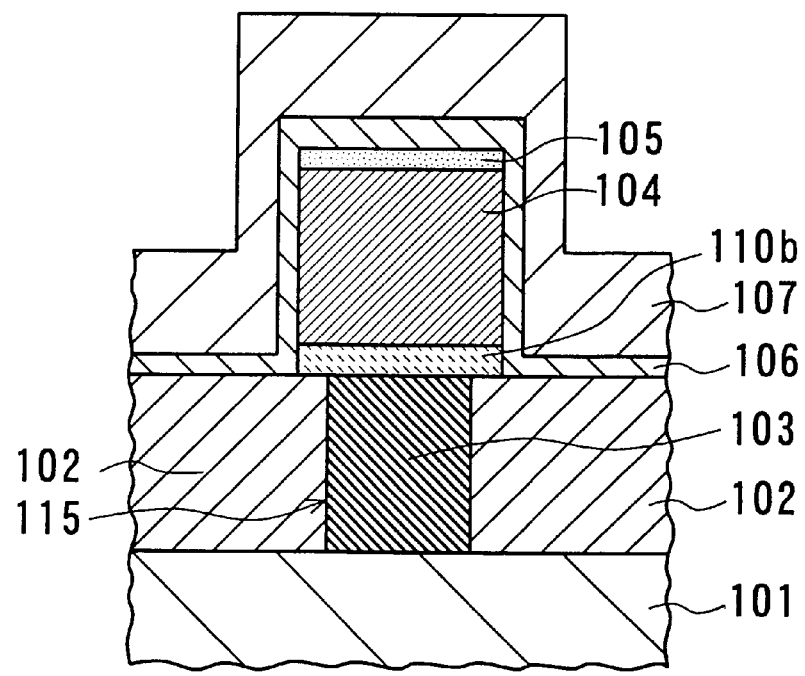
FIG. 11B is a partial, cross-sectional view of a capacitor according to a fourth embodiment of the present invention.

FIG. 11B shows the configuration of a capacitor applied to a Gigabit-scale DRAM according to a fourth embodiment of the present invention.

The capacitor according to the fourth embodiment has the same configuration as that of the first embodiment except that a diffusion barrier layer 110b is additionally formed between the polysilicon contact plug 103 and the lower electrode 104. Unlike the third embodiment, the diffusion barrier layer 110b is not located in the contact hole 115 of the interlayer insulating layer 102, but on the interlayer insulating layer 102.

The diffusion barrier layer 110b prevents the silicon atoms contained in the plug 103 from diffusing into the lower electrode 104. As a result, there is the same advantage as that of the third embodiment.

Fifth Embodiment

Figure 12:
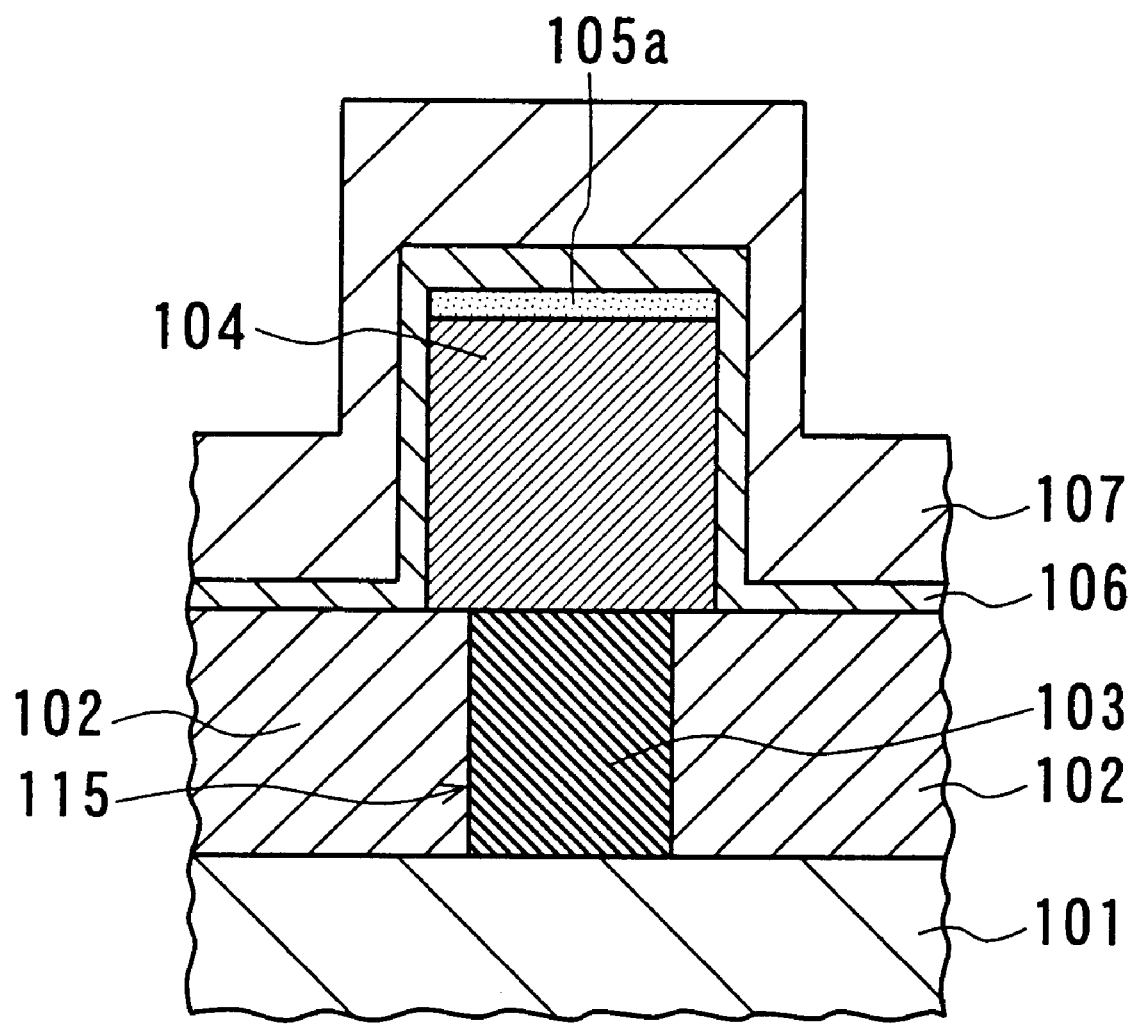
FIG. 12 is a partial, cross-sectional view of a capacitor according to a fifth embodiment of the present invention.

FIG. 12 shows the configuration of a capacitor applied to a Gigabit-scale DRAM according to a fifth embodiment of the present invention.

The capacitor according to the fifth embodiment has the same configuration as that of the first embodiment except that an insulating cap layer 105a is made of $SiO_2$ fabricated by a plasma-enhanced CVD process at a temperature of 400° C. instead of the $SOG-SiO_2$.

Figure 13:
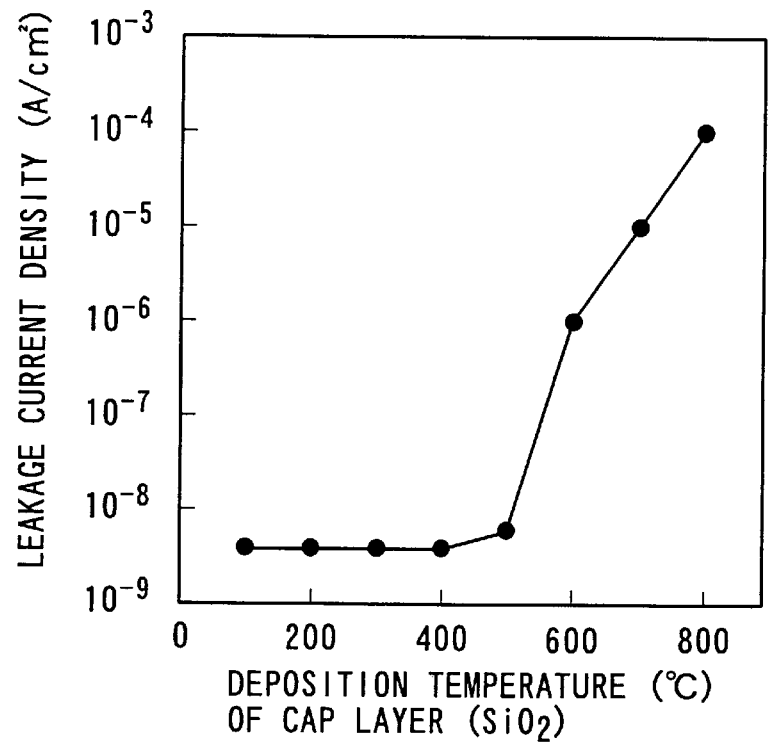
FIG. 13 is a graph showing the temperature dependence of the leakage current density according to the fifth embodiment of the present invention with respect to the insulator formation temperature.

FIG. 13 shows the temperature dependence of the leakage current density according to the fifth embodiment of the present invention as a function of the deposition temperature of the cap layer 105a made of plasma-CVD $SiO_2$.

As seen from FIG. 13, when the deposition temperature is lower than 600° C., the leakage current density is kept at approximately $5 \times 10^{-9}$ $A/cm^2$. However, the leakage current density increases rapidly at the deposition temperature equal to 600° C. or higher. This increase of the leakage current density is caused by the fact that $RuO_2$ forming the lower electrode 104 is changed to $RuO_4$ or $RuO_3$ to be vaporized at the deposition temperature equal to 600° C. or higher, resulting in the increased surface roughness of the side faces of the lower electrode 104.

Accordingly, it is preferred that the insulating cap layer 105a is made of a material capable of deposition at a deposition temperature lower than 600° C.

Plasma-enhanced CVD $SiO_2$ and $SOG-SiO_2$ are used in this fifth embodiment and the previously-described first embodiment, respectively. However, any other material may be used in the present invention if it is capable of deposition at a temperature lower than 600° C. and has a good adhesion characteristic to the lower electrode 104 and the dielectric layer 106.

For example, in oxides and nitrides that contain Si as a main ingredient, Boro-PhosphoSilicate Glass (BPSG), PhosphoSilicate Glass (PSG), and plasma-enhanced CVD $SiN_x$ may be used as the insulating cap layer 105a.

It is needless to say that the insulating cap layer 105a may have a two-layer structure or any other multi-layer structure using these materials.

Figure 14:
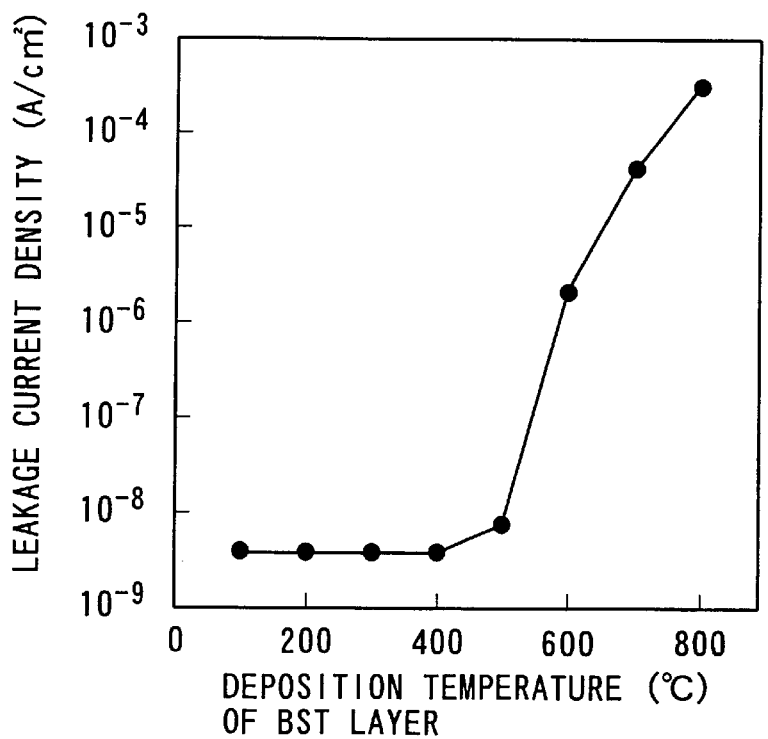
FIG. 14 is a graph showing the temperature dependence of the leakage current density according to the fifth embodiment of the present invention with respect to the BST formation temperature.

FIG. 14 shows the temperature dependence of the leakage current density according to the fifth embodiment of the present invention as a function of the deposition temperature of the dielectric layer 106 made of BST.

As seen from FIG. 14, when the deposition temperature is lower than 600° C., the leakage current density is approximately $5 \times 10^{-9}$ $A/cm^2$. However, the leakage current density increases rapidly with the rising deposition temperature. This increase of the leakage current density is caused by the same fact as explained for the insulating cap layer 105a.

Accordingly, it is preferred that the dielectric layer 106 is made of a material capable of deposition at a temperature lower than 600° C.

Here, $Ru_2O$ is used for the lower electrode 104. However, any other material such as Ru, $IrO_2$, Ir, W, $WN_x$, TiN, Ti, and Pd may be used for the lower electrode 104 in the present invention.

Pt may be used for the lower electrode 104. In this case, the deposition of the dielectric layer 106 and lower electrode 104 need not to be carried out at a temperature lower than 600° C. This is because Pt is not vaporized.

Sixth Embodiment

Figure 15:
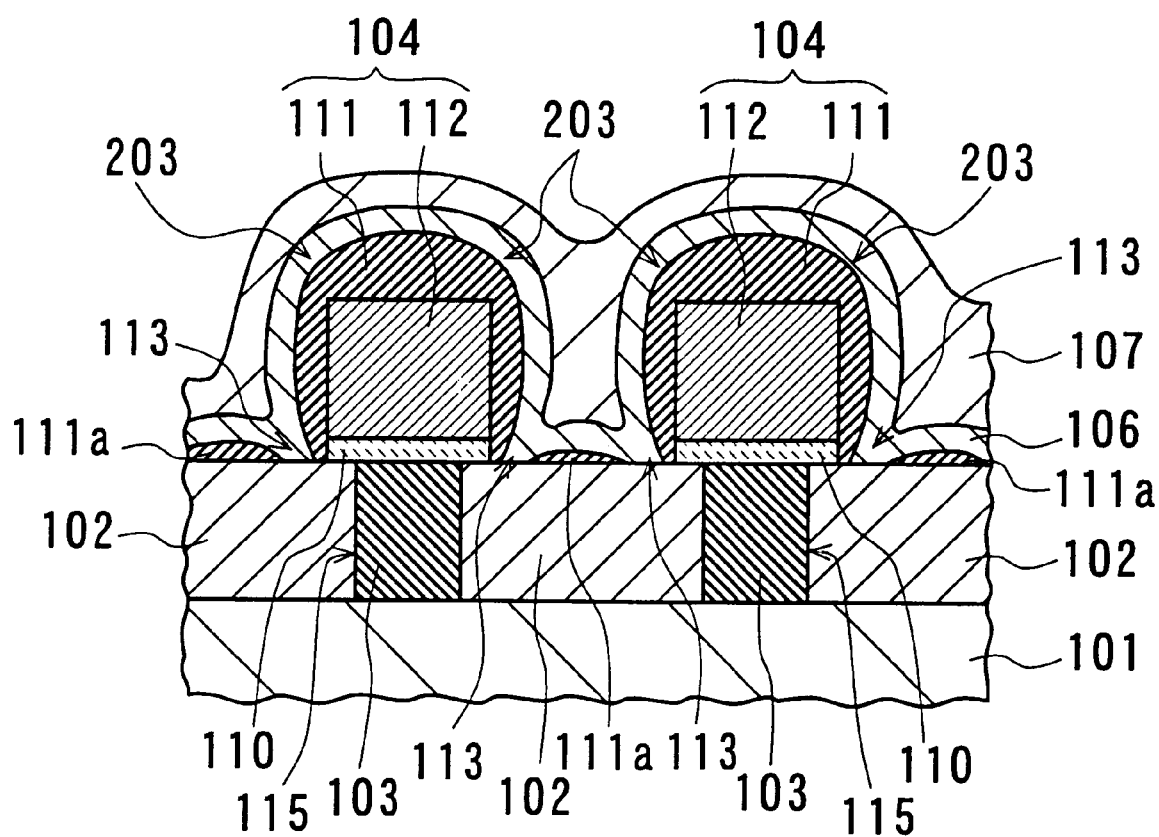
FIG. 15 is a partial, cross-sectional view of a capacitor according to a sixth embodiment of the present invention.

FIG. 15 shows the configuration of a capacitor applied to a Gigabit-scale DRAM according to a sixth embodiment of the present invention.

Although a lot of storage capacitors are formed on a silicon substrate in FIG. 15, only two of them are shown in FIG. 15 for the sake of simplification. These two capacitors have the same configuration as one another.

In FIG. 15, an interlayer insulating layer 102 with a thickness of 500 nm is formed on a main surface of an n-type single-crystal Si substrate 101 with a resistivity of 0.01 Ω·cm. The interlayer insulating layer 102, which is made of $SiO_2$, has two contact holes 115 filled with contact plugs 103 made of phosphorus-doped polysilicon. The bottoms of the contact plugs 103 are contacted with and electrically connected to the substrate 101, and the tops of the contact plugs 103 are exposed from the layer 102.

Two diffusion barrier layers 110 with a thickness of 100 nm are formed on the interlayer insulating layer 102 to be contacted with the top of the polysilicon contact plugs 103. The diffusion barrier layers 110 serving as diffusion barriers to Si are made of TiN.

Two core parts 112 of two lower electrodes 104, which has a thickness of 300 nm, are formed on the corresponding diffusion barrier layers 110. The core parts 112 of the lower electrodes 104 are made of conductive $RUO_2$ and have a rectangular cross section.

Two shell parts 111 of the lower electrodes 104 are formed to cover the corresponding core parts 112. The shell parts 111 of the lower electrodes 104 are made of conductive RuOz and have round surfaces, as clearly seen from FIG. 15. Therefore, the regions of the shell parts 111 are round and as a result, no edge is formed near the top corners of the core parts 112 between the lower electrodes 104 and the side faces thereof.

The reference numeral 111a denotes redundant $RuO_2$ deposited onto the interlayer insulating layer 102 between the two lower electrodes 104.

A high-dielectric-constant dielectric layer 106, which is made of polycrystalline BST, is formed to cover the lower electrodes 104. The dielectric layer 106 is contacted with the round surface of the shell parts 111 of the lower electrodes 104, the redundant $RuO_2$, and the uncovered surface of the interlayer insulating layer 102. The shell parts 111 are electrically separated from one another, because one of the two shell parts 111 is apart from another by the dielectric layer 106 even if the redundant $RuO_2$ exists between them.

An upper electrode 107 is formed on the dielectric layer 106. The upper electrode 107 is made of Ru and contacted with the dielectric layer 106.

With the capacitor according to the sixth embodiment of the present invention, each of the lower electrodes 104 includes the $RuO_2$ core part 112 and the $RuO_2$ shell part 111 surrounding the core part 112. The shell part 111 has a diffusion barrier property to oxygen. Thus, the core part 112 is covered with or protected by the shell part 111 having a diffusion barrier property to oxygen.

Accordingly, the diffusion barrier layers 110 formed on the interlayer insulating layer 102 are prevented from being oxidized during a subsequent heat-treatment process. As a result, the contact resistance of each lower electrode 104 is prevented from increasing even if the diffusion barrier layers 110 are provided.

Additionally, even if a seam defect occurs in the dielectric layer 106, the upper electrode 107 is prevented from being contacted with the lower electrode 104 due to the existence of the round surface of the shell parts 111 of the lower electrodes 104. Thus, there is an advantage that the leakage current between the upper and lower electrodes 107 and 104 can be decreased.

The capacitor according to the sixth embodiment is fabricated in the following way.

Figure 17A:
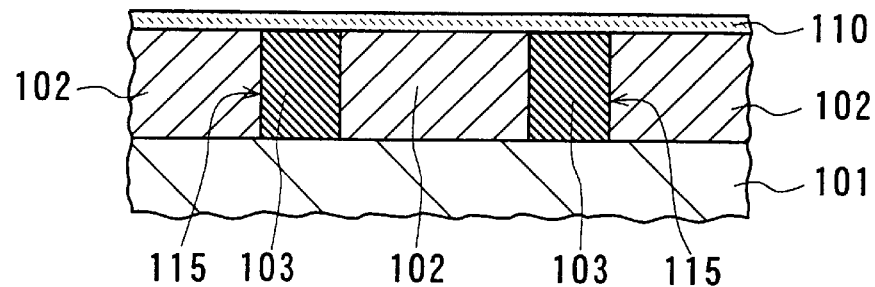
FIGS. 17A to 17E are partial, cross-sectional views of a capacitor showing a fabrication method of the capacitor according to the sixth embodiment in FIG. 15, respectively.

First, as shown in FIG. 17A, the $SiO_2$ interlayer insulating layer 102 with a thickness of 500 nm is formed on the main surface of the Si substrate 101 with a resistivity of 0.01 $\Omega$·cm by a thermal CVD process. Next, the penetrating contact holes 115 are formed in the interlayer insulating layer 102 by a dry etching process.

A phosphorus-doped polysilicon layer (not shown) with a thickness of 1 $\mu$m is formed on the interlayer insulating layer 102 so as to fill the contact holes 115 of the layer 102 by a CVD process. Then, the phosphorus-doped polysilicon layer is selectively etched back by a RIE process using Cl2 as an etching gas, thereby leaving the polysilicon film in the contact holes 115. Thus, the polysilicon plugs 103 are formed in the interlayer insulating layer 102, as shown in FIG. 17A.

Subsequently, a TiN layer 110 with a thickness of 100 nm is deposited on the interlayer insulating layer 102 by a reactive sputtering process at room temperature, in which a Ru target is used. The state at this stage is shown in FIG. 17A.

Figure 17B:
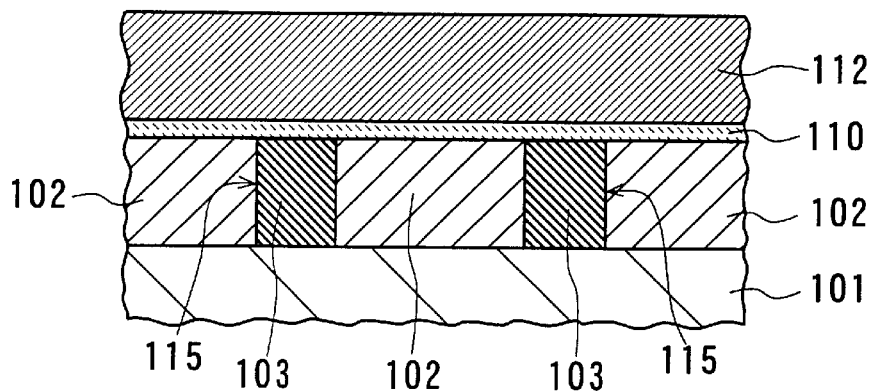

Further, a $RuO_2$ layer 112 with a thickness of 300 nm is deposited on the TiN layer 110 by a reactive sputtering process at room temperature, in which a Ru target is used. The state at this stage is shown in FIG. 17B.

Figure 17C:
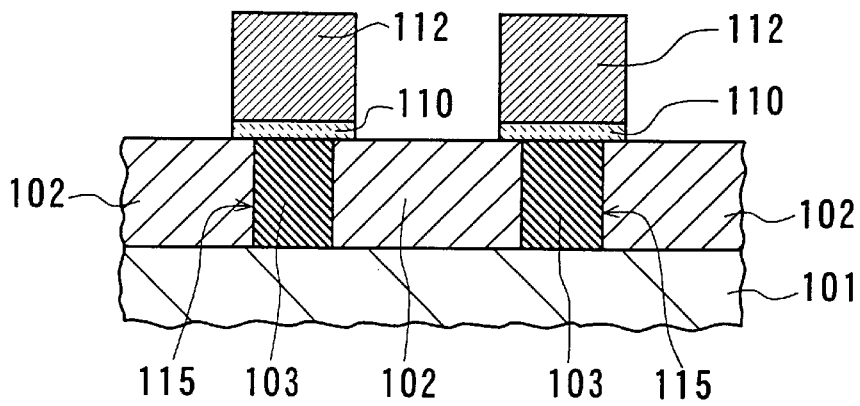

On the $RuO_2$ layer 112 thus deposited, a photoresist film (not shown) is formed. Then, the photoresist film is exposed and developed to form a photoresist mask (not shown) with a same plan shape as the core part 112 of the lower electrode 104. While using the photoresist mask, the $RuO_2$ layer 112 and the TiN layer 110 are patterned by an ECR plasma etching process, thereby forming the core parts 112 of the lower electrodes and the corresponding diffusion barrier layers 110. The photoresist mask is then removed. The state at this time is shown in FIG. 17C.

Figure 17D:
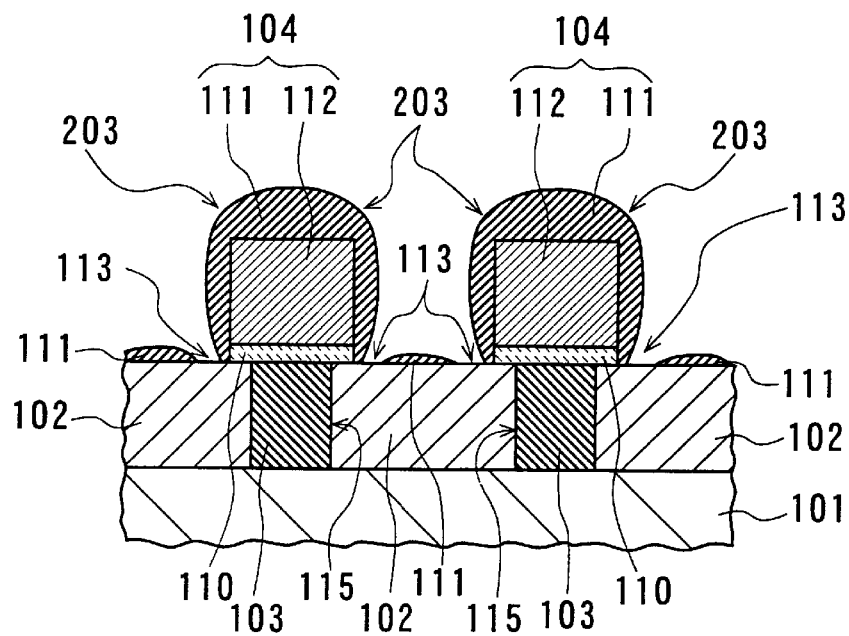

Following this, a $RuO_2$ layer (not shown) is deposited to cover the core parts 112 of the lower electrodes 104 by a reactive sputtering process. Because the reactive sputtering process of $Ru_2O$ has a low step-coverage capability, almost all the $RuO_2$ layer is deposited onto the top and side faces of the adjoining core parts 111, thereby forming the $RuO_2$ shell parts 111 of the lower electrodes 104, as shown in FIG. 17D. During this process, a small part of the $RuO_2$ layer is deposited onto the uncovered surface of the interlayer insulating layer 102 between the adjoining core parts 112, thereby forming the redundant $RuO_2$ 111a.

Figure 17E:
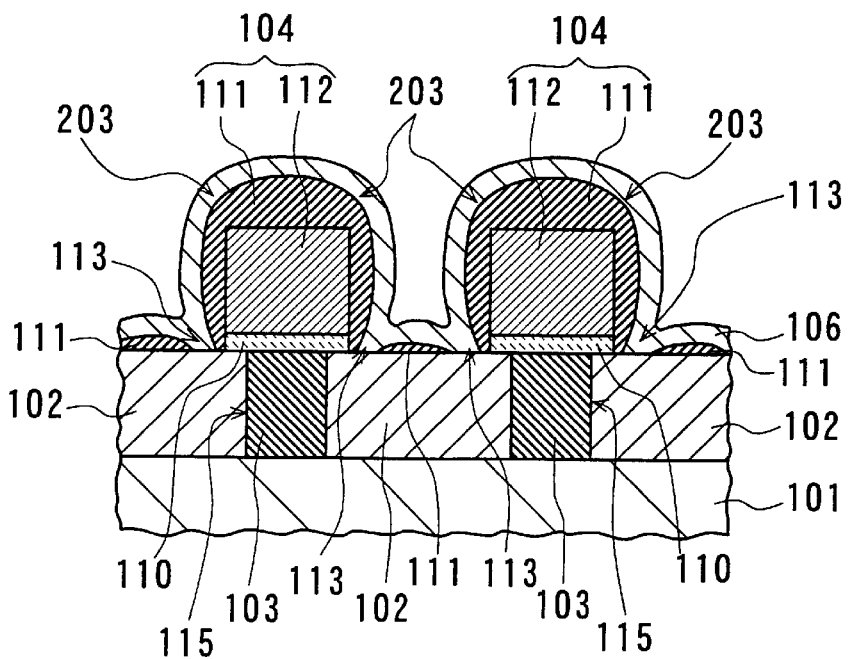

Due to the low step-coverage capability, the $RuO_2$ shell parts 111 formed on the core parts 112 are separated from and electrically insulated from the adjoining redundant $RuO_2$ 111a at the positions 113, as shown in FIG. 17E. Consequently, there Is an advantage that the formation of the shell parts 111 can be achieved without any patterning process for the $RuO_2$ layer. This means that the count of the necessary process steps is not increased due to addition of the shell parts 111.

The thickness of the $RuO_2$ layer is determined so that the adjoining shell parts 111 are electrically separated from one another.

Moreover, in the same way as that of the first embodiment, the polycrystalline BST layer 106 is formed to cover the shell parts 111 of the lower electrodes 104, and then, the upper electrode 107 is formed on the BST layer 106, as shown in FIG. 15.

Thus, the capacitor according to the sixth embodiment is fabricated.

With the fabrication method according to the sixth embodiment, the $RuO_2$ shell parts 111 of the lower electrodes 104 are formed by the reactive sputtering process (one of PVD processes) having a bad step-coverage capability. Therefore, the $RuO_2$ layer for the shell parts 111 is automatically divided by the core parts 112 of the lower electrodes 104 and electrically separated from one another at the positions 113 without patterning processes for the $RuO_2$ layer.

There is the same advantage if the $RuO_2$ shell parts 111 may be formed by using an evaporation process (one of PVD processes).

To confirm the advantage of the present invention, the inventor actually fabricated the capacitor according to the sixth embodiment and a capacitor having a conventional structure as a third comparative example. The third comparative example has the same configuration as the sixth embodiment except that the $Ru_2O$ shell parts 112 are omitted. Then, the contact resistance of the lower electrode was measured f or these capacitors. The result of this measurement is shown in FIG. 16.

As shown In FIG. 16, the curve 305 indicates the contact resistance characteristic of the capacitor according to the sixth embodiment and the curve 306 indicates that of the third comparative example.

It is seen from the curve 305 in FIG. 16 that the contact resistance kept low independent of the deposition temperature of the BST layer 106 in the sixth embodiment. This is due to the fact that the oxygen is effectively prevented from diffusing from the ambient atmosphere into the core parts 112 of the lower electrodes 104 by the $RuO_2$ shell parts 111.

On the other hand, it is seen from the curve 306 in FIG. 16 that the contact resistance of the lower electrodes increases with the rising deposition temperature of the BST layer in the third comparative example. This is due to progressing oxidation of the diffusion barrier layers 110 due to applied heat. Finally, the capacitor of the third comparative example will lose the capacitor function.

In the sixth embodiment, the diffusion barrier layers 110 for silicon are made of TIN, and the shell parts or diffusion barrier layers 111 for oxygen are made of $RuO_2$. However, the diffusion barrier layers 110 for silicon may be made of $TiO_2$ or $TiS_2$. The shell parts 111 of the lower electrodes 104 may be made of $RuO_2$, Ru, $IrO_2$, Ir, W, or $WN_x$.

Seventh Embodiment

Figure 18:
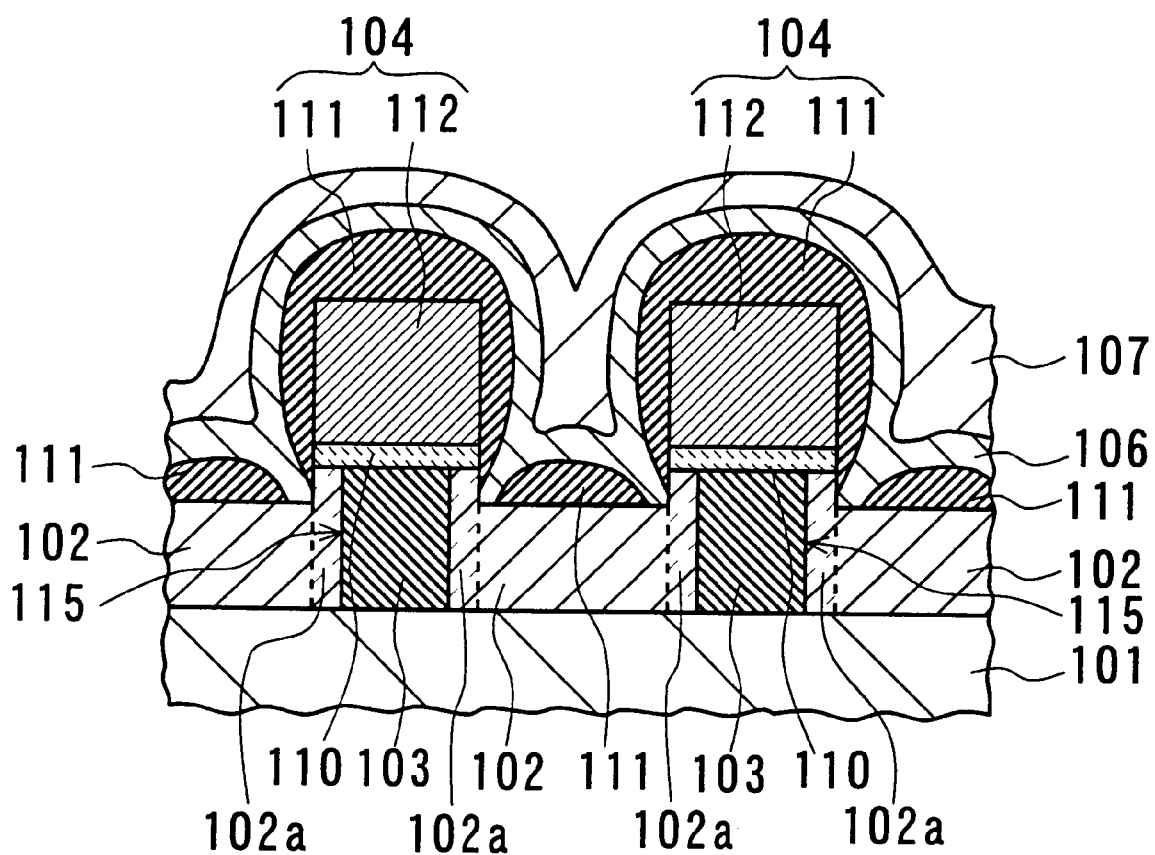
FIG. 18 is a partial, cross-sectional view of a capacitor according to a seventh embodiment of the present invention.

FIG. 18 shows the configuration of a capacitor applied to a Gigabit-scale DRAM according to a seventh embodiment of the present invention.

The capacitor according to the seventh embodiment has the same configuration as the sixth embodiment except that two parts 102a of the interlayer insulating layer 102 are thicker than the remainder of the layer 102. The parts 102a of the interlayer insulating layer 102 surround the corresponding contact plugs 103 and they are located just below the corresponding lower electrodes 104. The parts 102a of the interlayer insulating layer 102 have a thickness of 500 nm, and the remainder of the insulating layer 102 has a thickness of 300 nm.

To confirm the advantage of the present invention, the inventor actually fabricated a hundred of the capacitor according to the seventh embodiment and a hundred of the capacitor having the same configuration as the seventh embodiment except that the shell parts 111 of the lower electrodes 104 are not provided as a fourth comparative example.

Figure 19:
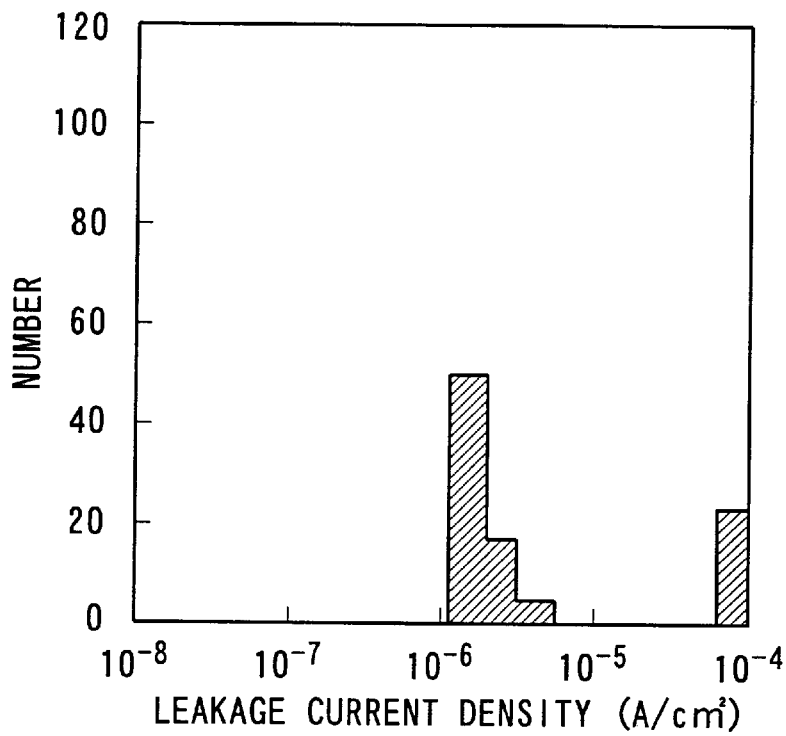
FIG. 19 is a graph showing the distribution of the leakage current density of a capacitor of a fourth comparative example.
Figure 20:
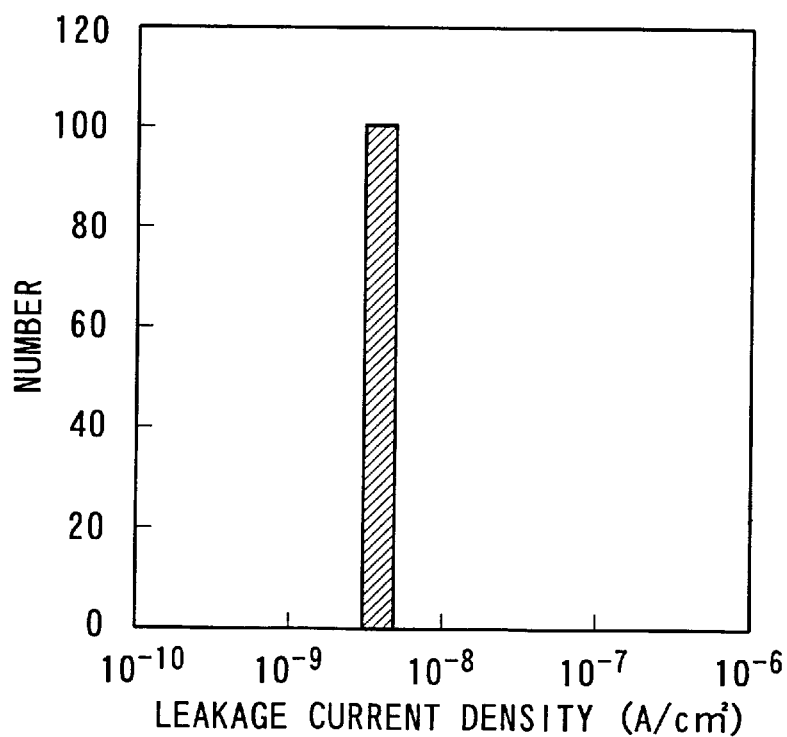
FIG. 20 is a graph showing the distribution of the leakage current density of a capacitor according to the seventh embodiment of the present invention.

FIGS. 19 and 20 show the distribution of the leakage current density of the capacitor according to the fourth comparative example and that according to the seventh embodiment, respectively.

In the capacitor according to the fourth comparative example, as shown in FIG. 19, almost all the capacitors has a leakage current density of approximately $1 \times 10^{-6}$ A/cm$^2$ and a part of these capacitors are in short circuit.

On the other hand, in the capacitor according to the seventh embodiment, as shown in FIG. 20, all the capacitors has a leakage current of $4 \times 10^{-9}$ A/cm$^2$. Therefore, the capacitor according to the seventh embodiment has a better distribution of the leakage current density than the fourth comparative example.

With the capacitor according to the seventh embodiment, since each of the shell parts 111 of the lower electrodes 104 has a round surface and has no edge, no defects such as a seam and crack occur In the BST layer 106.

Also, because of the same reason as shown in the second embodiment, the upper and lower electrodes 107 and 104 are not contacted with one another even if the defects such as a seam and crack occur in the BST layer 106, which decreases the leakage current.

Eighth Embodiment

Figure 21:
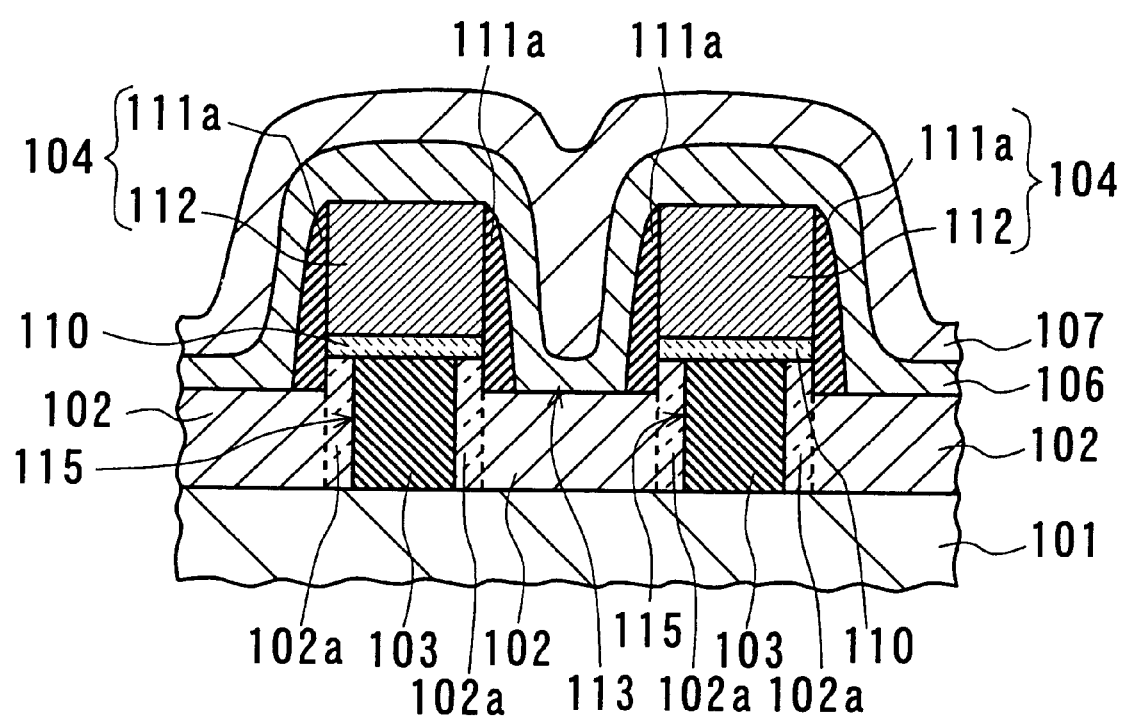
FIG. 21 is a partial, cross-sectional view of a capacitor according to an eighth embodiment of the present invention.

FIG. 21 shows the configuration of a capacitor applied to a Gigabit-scale DRAM according to an eighth embodiment of the present invention.

The capacitor according to the eighth embodiment has the same configuration as the seventh embodiment except that the tops of the core parts 112 are exposed from the corresponding shell parts 111a and that the redundant RuO$_2$ on the interlayer insulating layer 102 is removed.

The capacitor according to the eighth embodiment is fabricated in the following way.

Figure 22A:
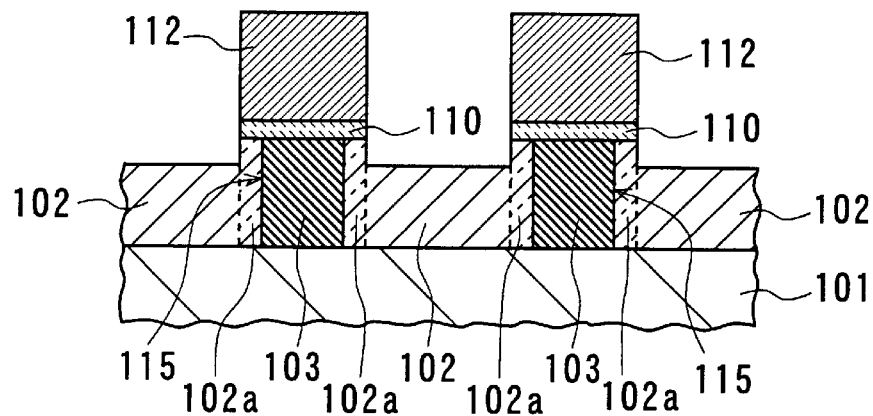
FIGS. 22A to 22C are partial, cross-sectional views of a capacitor showing a fabrication method of the capacitor according to the eighth embodiment in FIG. 21, respectively.

First, as shown in FIG. 22A, two parts 102a of the interlayer insulating layer 102 are formed to be thicker than the remainder of the layer 102. The parts 102a of the interlayer insulating layer 102 surround the corresponding contact plugs 103 and they are located just below the corresponding lower electrodes 104. The parts 102a of the interlayer insulating layer 102 have a thickness of 500 nm, and the remainder of the insulating layer 102 has a thickness of 300 nm.

Figure 22B:
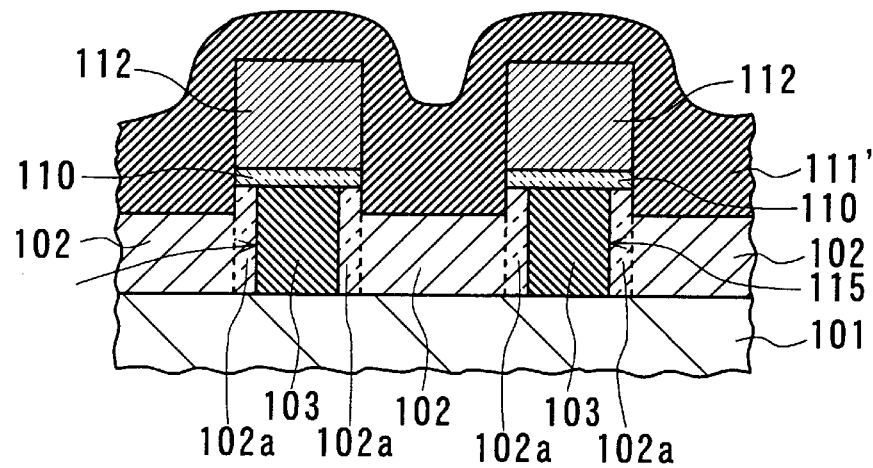

Next, a RuO$_2$ layer 111' is formed to cover the core parts 112 of the lower electrodes 104 and the diffusion barrier layers 110, as shown in FIG. 22B.

Following this, the RuO$_2$ layer 111' is etched back until the layer 111' is divided or separated between the core parts 112 of the lower electrodes 104, as shown in FIG. 42C. During this process, the redundant RuO$_2$ on the interlayer insulating layer 102 is removed.

The subsequent processes are the same as those in the seventh embodiment.

Figure 22C:
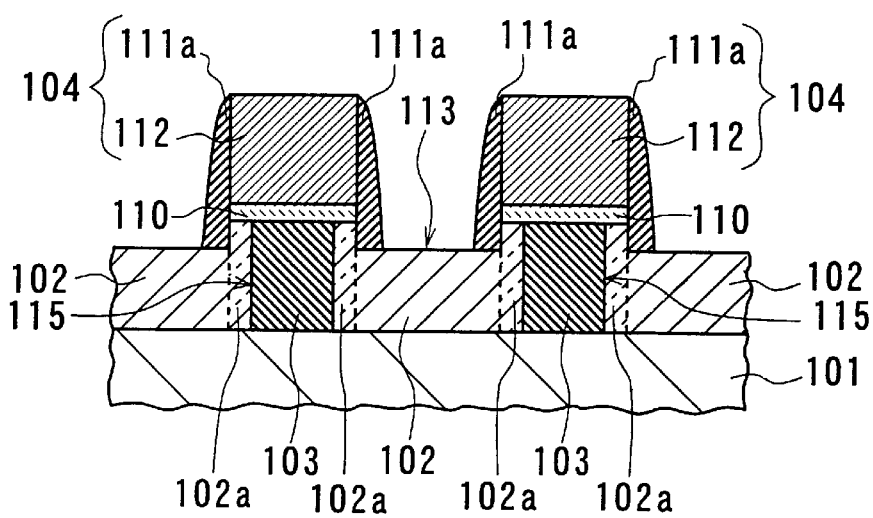

There is an additional advantage that the thickness of the RuO$_2$ layer 111' can be widely controlled by adjusting the etch back condition for the etch back process shown in FIG. 22C, compared with the seventh embodiment.

Because the positions 113 are formed wider, there is another additional advantage that short circuit is sure to be prevented from occurring between the adjoining lower electrodes 104, thereby improving the device Isolation performance compared with the seventh embodiment.

Ninth Embodiment

Figure 23:
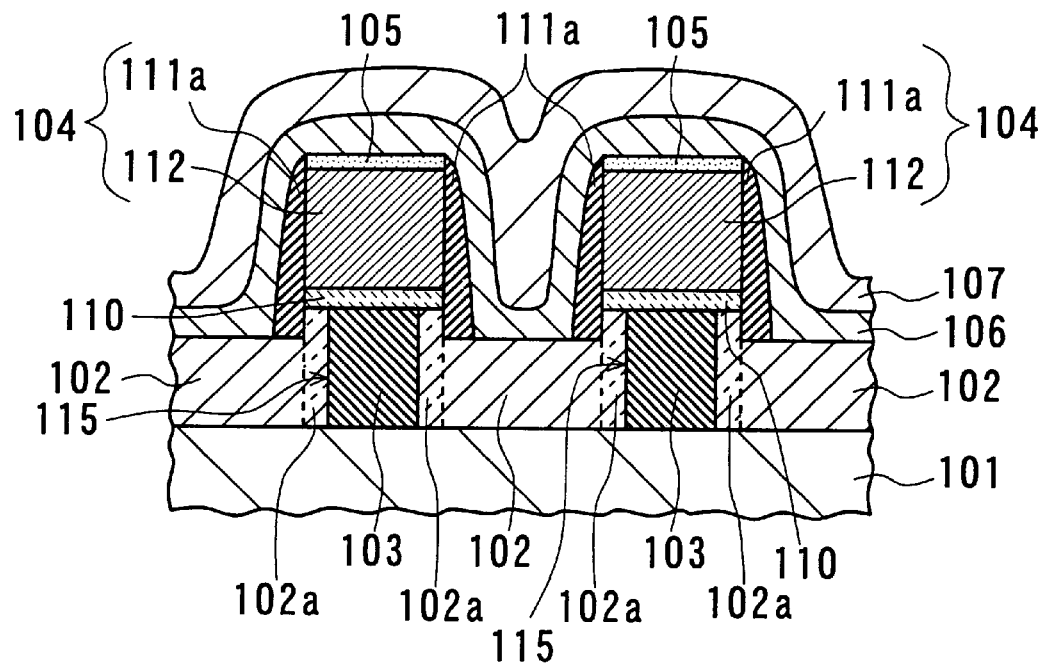
FIG. 23 is a partial, cross-sectional view of a capacitor according to a ninth embodiment of the present invention.

FIG. 23 shows the configuration of a capacitor applied to a Gigabit-scale DRAM according to a ninth embodiment of the present invention.

The capacitor according to the ninth embodiment has the same configuration as the eighth embodiment except that the insulating cap layers 105 are formed on the tops of the shell parts 112 of the lower electrodes 104.

Tenth Embodiment

Figure 24:
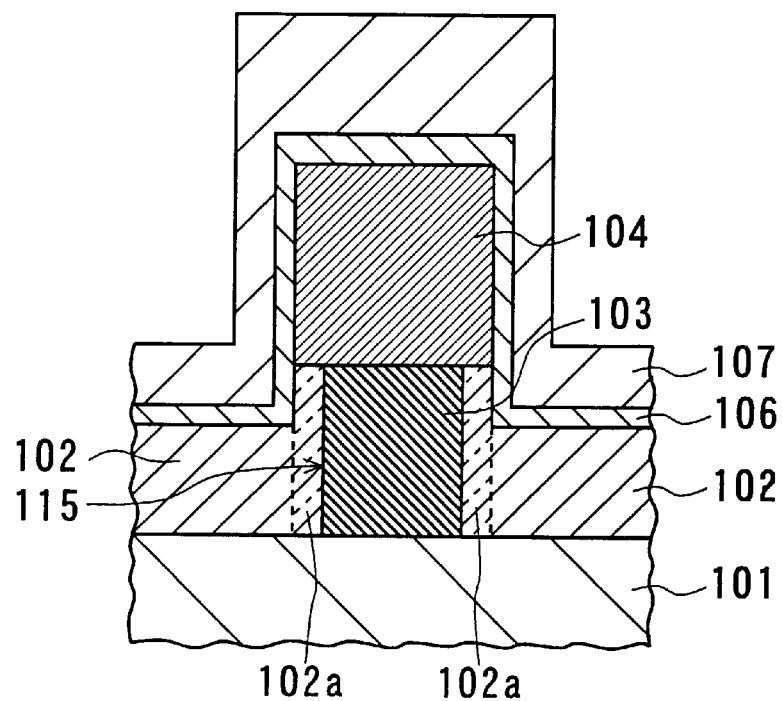
FIG. 24 is a partial, cross-sectional view of a capacitor according to a tenth embodiment of the present invention.

FIG. 24 shows the configuration of a capacitor applied to a Gigabit-scale DRAM according to a tenth embodiment of the present invention.

Figure 2:
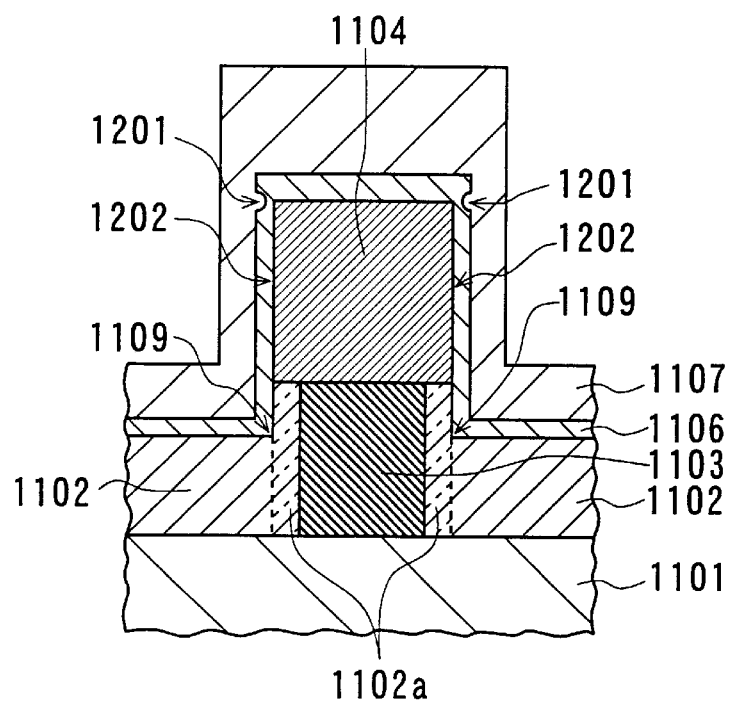
FIG. 2 is a partial, cross-sectional view of another conventional capacitor.

The capacitor according to the tenth embodiment has the same configuration as the third embodiment shown in FIG. 7 except that the insulating cap layer 105 is not formed. Although this configuration is the same as that shown in FIG. 2, this configuration is different from the conventional configuration of FIG. 2 in that the capacitor dielectric layer 106 is formed by a PVD process, not a CVD process.

To confirm the advantage of the present invention, the inventor actually fabricated a hundred of the capacitor according to the tenth embodiment and a hundred of the capacitor having the conventional configuration as shown in FIG. 1. Then, he measured the leakage current characteristics of them.

Figure 25:
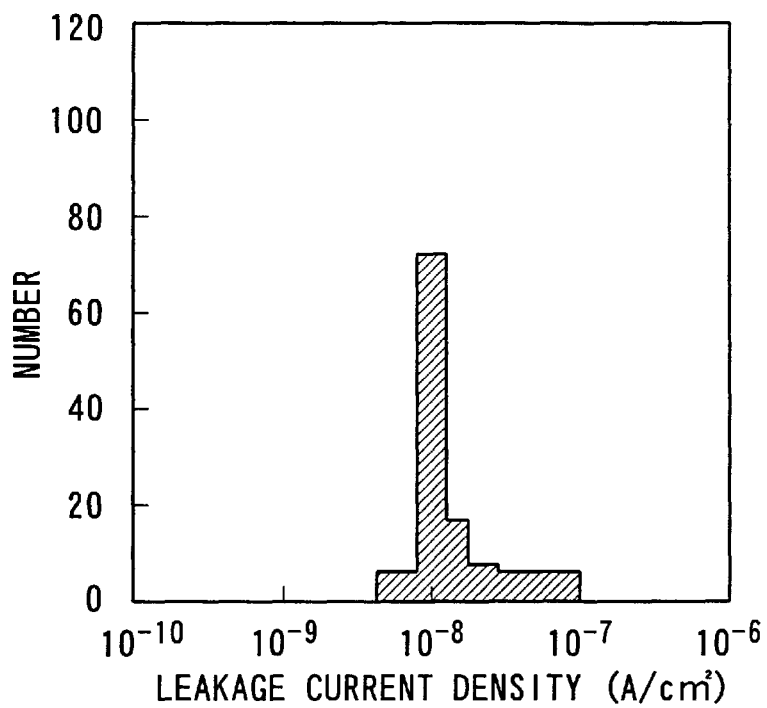
FIG. 25 is a graph showing the distribution of the leakage current density of a capacitor of a fifth comparative example.
Figure 26:
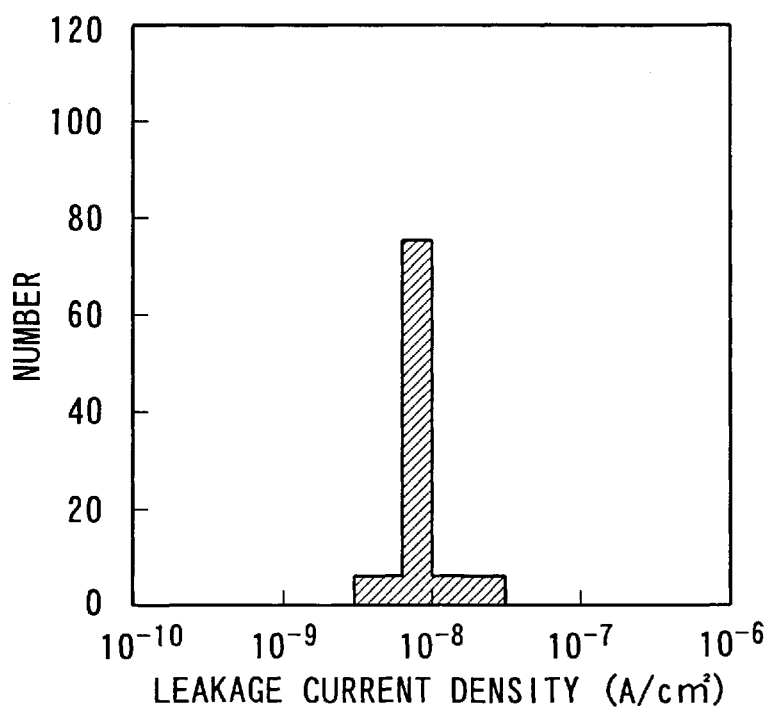
FIG. 26 is a graph showing the distribution of the leakage current density of a capacitor according to the tenth embodiment of the present invention in FIG. 24.

FIGS. 25 and 26 show the distribution of the leakage current density of the capacitor according to the tenth embodiment and the conventional capacitor of FIG. 1, respectively.

It is known from FIGS. 25 and 26 that the capacitor according to the tenth embodiment has a narrower fluctuation range than the conventional one of FIG. 1, improving the leakage current characteristic. The reason of this advantage is as follows:

A sputtering process has a larger directionality of particles than that of a CVD process and as a result, the sputtered particles do not cover the surface roughness of the side faces of the lower electrodes 104, resulting in the non-uniform thickness of the dielectric layer 106 and quality degradation of the layer 106.

Eleventh Embodiment

Figure 27:
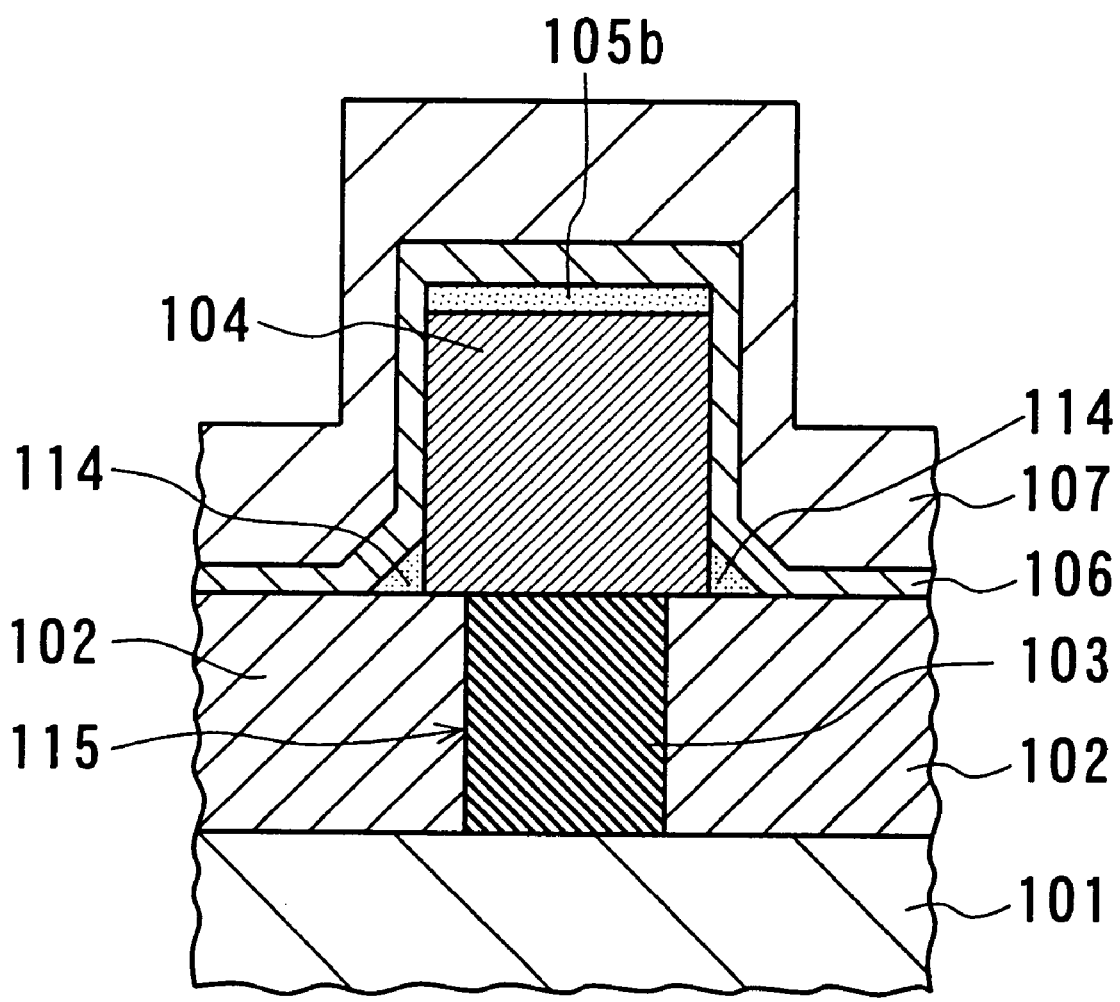
FIG. 27 is a partial, cross-sectional view of a capacitor according to an eleventh embodiment of the present invention.

FIG. 27 shows the configuration of a capacitor applied to a Gigabit-scale DRAM according to an eleventh embodiment of the present invention.

The capacitor according to the eleventh embodiment has the same configuration as the first embodiment shown in FIG. 3 except that the insulating cap layer 105 is made of SiN$_x$ and a SiO$_2$ layer 114 is formed at each lower corner of the lower electrode 104.

Therefore, because of the SiO$_2$ layer 114, the upper and lower electrodes 107 and 104 are sure not to be contacted with one another even if the defects such as a seam and crack occur in the BST layer 106 at the lower corner of the lower electrode 104. This further decreases the leakage current compared with the first embodiment in FIG. 3.

Figure 28A:
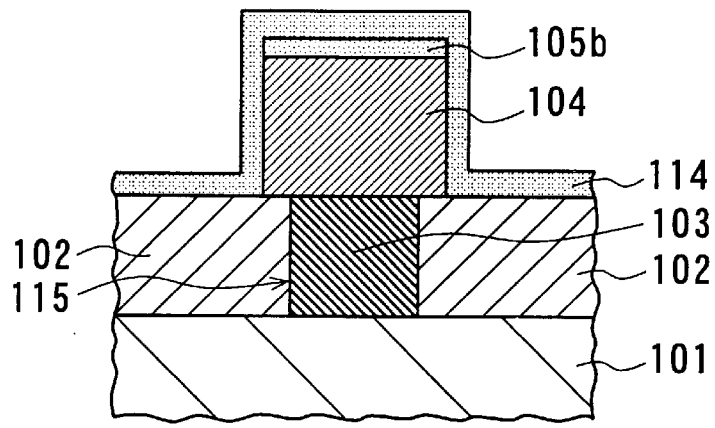
FIGS. 28A to 28C are partial, cross-sectional views of a capacitor showing a fabrication method of the capacitor according to the eleventh embodiment in FIG. 27, respectively.
Figure 28B:
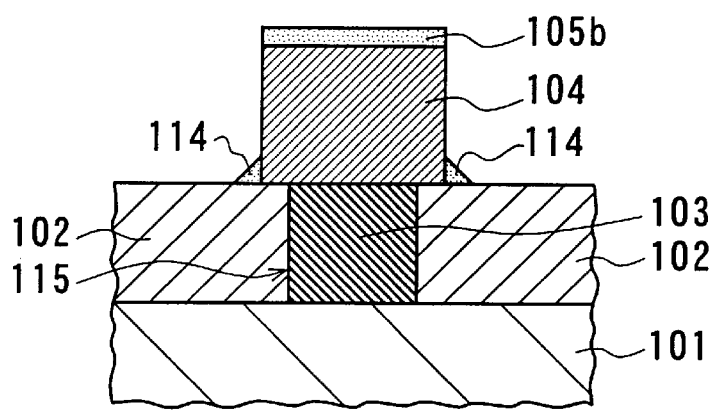
Figure 28C:
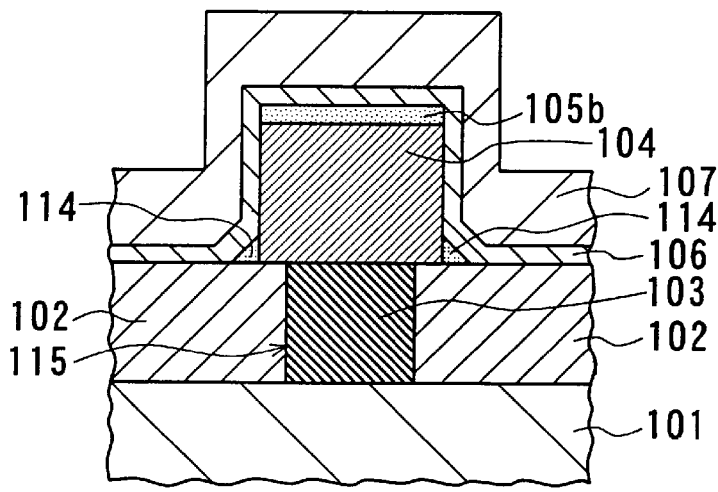

FIGS. 28A to 28C show the fabrication processes of the capacitor according to the eleventh embodiment.

As shown in FIG. 28A, the SiO$_2$ layer 114 with a thickness of 200 nm is formed on the interlayer insulating layer 102 to cover the lower electrode 104 and the SiN$_x$ cap layer 105 by a CVD process.

Next, as shown FIG. 28B, the SiO$_2$ layer 114 thus formed is etched back, thereby leaving selectively the SiO$_2$ layer 114 at the lower corners of the lower electrode 104.

Moreover, the subsequent processes are performed in the same way as that of the first embodiment, thereby fabricating the configuration shown in FIG. 28C.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A capacitor comprising:

(a) a diffusion barrier layer on an interlayer insulating layer having a conductive contact plug therein;

a bottom face of said diffusion barrier layer contacting said contact plug;

(b) a thick lower electrode on said diffusion barrier layer;

said lower electrode including a core part having a top face, a bottom face, and side faces and a shell part surrounding said core part;

said top and side faces of said core part being covered with said shell part;

said bottom face of said core part not being covered with said shell part and contacting said diffusion barrier layer;

said shell part of said lower electrode having a convex and round surface;

said shell part of said lower electrode being a diffusion barrier to oxygen;

(c) a capacitor dielectric layer covering and contacting said convex and round surface of said shell part of said lower electrode;

(d) an upper electrode on and contacting said capacitor dielectric layer;

wherein said capacitor dielectric layer is sandwiched by said upper and lower electrodes to thereby constitute a capacitor structure.

2. A capacitor as claimed in claim 1, wherein said core part of said lower electrode is entirely covered with said shell part thereof.

3. A capacitor as claimed in claim 1, wherein said core part of said lower electrode is partially covered with said shell part thereof while uncovering said top face of said core part from said shell part.

4. A capacitor as claimed in claim 1, wherein said diffusion barrier layer formed on said interlayer insulating layer has a diffusion barrier property to silicon.

5. A capacitor comprising:

an interlayer insulating layer having an upper surface;

an electrically conductive contact plug that extends through said interlayer insulating layer to the upper surface;

a lower electrode having a top surface, a bottom surface and side surfaces, the bottom surface being directly on said contact plug and the upper surface of said interlayer insulating layer;

a capacitor dielectric layer on the top surface of said lower electrode and directly on the side surfaces of said lower electrode and the upper surface of said interlayer insulating layer;

a corner electrical insulator at a corner of the upper surface of said interlayer insulating layer and the side surfaces of said lower electrode, said corner insulator being between and directly contacting said capacitor dielectric layer and the side surfaces of said lower electrode and the upper surface of said interlayer insulating layer; and an upper electrode directly on said capacitor dielectric layer.

6. The capacitor of claim 5, further comprising an insulating cap layer between and directly contacting the top surface of said lower electrode and said capacitor dielectric layer.

* * * * *